(12) United States Patent
Saiki et al.

(10) Patent No.: US 10,304,905 B2
(45) Date of Patent: May 28, 2019

(54) LIGHT-EMITTING MODULE

(71) Applicant: KANEKA CORPORATION, Osaka-shi, Osaka (JP)

(72) Inventors: Hidemaro Saiki, Misawa (JP); Akira Nishikawa, Kamikita-gun (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 239 days.

(21) Appl. No.: 15/525,510

(22) PCT Filed: Jan. 29, 2016

(86) PCT No.: PCT/JP2016/052793
§ 371 (c)(1),
(2) Date: May 9, 2017

(87) PCT Pub. No.: WO2016/132871
PCT Pub. Date: Aug. 25, 2016

(65) Prior Publication Data
US 2017/0338283 A1    Nov. 23, 2017

(30) Foreign Application Priority Data

Feb. 20, 2015  (JP) ................................ 2015-032232

(51) Int. Cl.
*H01L 51/52* (2006.01)
*F21V 29/83* (2015.01)
(Continued)

(52) U.S. Cl.
CPC ............. *H01L 27/32* (2013.01); *F21S 2/005* (2013.01); *F21V 19/004* (2013.01);
(Continued)

(58) Field of Classification Search
CPC .... F21V 23/001; F21V 23/005; F21V 23/006; F21V 23/007; F21V 29/508; F21V 15/01;
(Continued)

(56) References Cited

U.S. PATENT DOCUMENTS

| | | |
|---|---|---|
| 2010/0213836 A1 | 8/2010 | Liao et al. |
| 2012/0169226 A1 | 7/2012 | Huang et al. |

(Continued)

FOREIGN PATENT DOCUMENTS

| | | |
|---|---|---|
| JP | 2001143864 A | 5/2001 |
| JP | 2001283606 A | 10/2001 |

(Continued)

OTHER PUBLICATIONS

European Patent Office, Supplementary European Search Report Issued in European Application No. 16752260, dated Sep. 7, 2017, The Hague, Netherlands, 2 pages.

(Continued)

*Primary Examiner* — Anh T Mai
*Assistant Examiner* — Steven Y Horikoshi
(74) *Attorney, Agent, or Firm* — Alleman Hall Creasman & Tuttle LLP

(57) ABSTRACT

To provide, in a simple and cost-effective manner, a planar light-emitting module with reduced thickness as a whole, with its substrate end ensuring shock resistance and low risk of injury, and being excellent in transferring and dissipating heat. A light-emitting module of the present invention includes: a bezel having a leg part having an inner height H; a planar light-emitting tile; and a printed circuit board having a plurality of heat dissipating through holes. A heat dissipating interval is provided between the printed circuit board and the mounted surface. The printed circuit board includes a tile-side main surface being a soaking metal layer including through hole openings.

21 Claims, 16 Drawing Sheets

(51) Int. Cl.
*H01L 27/32* (2006.01)
*F21V 19/00* (2006.01)
*F21V 23/00* (2015.01)
*F21S 2/00* (2016.01)
*F21S 8/00* (2006.01)
*F21V 15/01* (2006.01)
*F21Y 105/00* (2016.01)
*F21V 29/508* (2015.01)
*F21Y 115/15* (2016.01)
*F21Y 115/20* (2016.01)

(52) U.S. Cl.
CPC ............ *F21V 23/005* (2013.01); *F21V 29/83* (2015.01); *H01L 51/524* (2013.01); *H01L 51/5221* (2013.01); *F21S 8/03* (2013.01); *F21V 15/01* (2013.01); *F21V 23/001* (2013.01); *F21V 29/508* (2015.01); *F21Y 2105/00* (2013.01); *F21Y 2115/15* (2016.08); *F21Y 2115/20* (2016.08); *H01L 51/529* (2013.01); *H01L 51/5237* (2013.01); *H01L 2251/5361* (2013.01)

(58) Field of Classification Search
CPC .. F21V 19/003; F21V 19/0035; F21V 19/004; F21V 29/83; H01L 27/32; H01L 51/529; H01L 51/5237; H01L 51/524; H01L 2251/5361; H05B 33/12; F21S 8/02; F21S 8/022; F21S 8/024; F21S 8/026; F21S 8/03; F21S 8/032; F21S 8/033; F21Y 2105/00; F21Y 2105/10; F21Y 2105/16; F21Y 2115/20
See application file for complete search history.

(56) References Cited

U.S. PATENT DOCUMENTS

2013/0010482 A1 1/2013 Choi
2015/0034931 A1 2/2015 Matsuda

FOREIGN PATENT DOCUMENTS

| | | |
|---|---|---|
| JP | 2002050468 A | 2/2002 |
| JP | 2007324063 A | 12/2007 |
| JP | 2009231473 A | 10/2009 |
| JP | 2011003512 A | 1/2011 |
| JP | 2014017075 A | 1/2014 |
| JP | 2015018608 A | 1/2015 |
| JP | 2015022932 A | 2/2015 |

OTHER PUBLICATIONS

ISA Japan Patent Office, Written Opinion Issued in PCT Application No. PCT/JP2016/052793, dated May 10, 2016, WIPO, 3 pages.
ISA Japan Patent Office, International Search Report Issued in Application No. PCT/JP2016/052793, dated May 10, 2016, WIPO, 4 pages.

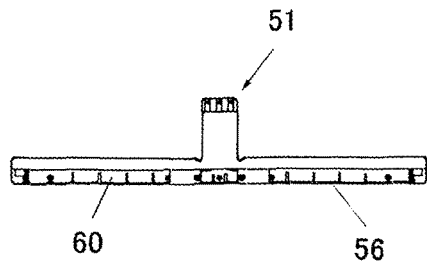
FIG. 9A WIRING SURFACE
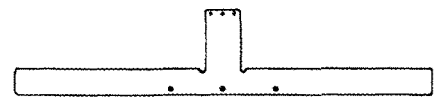
FIG. 9B WIRING MEMBER BACK SURFACE
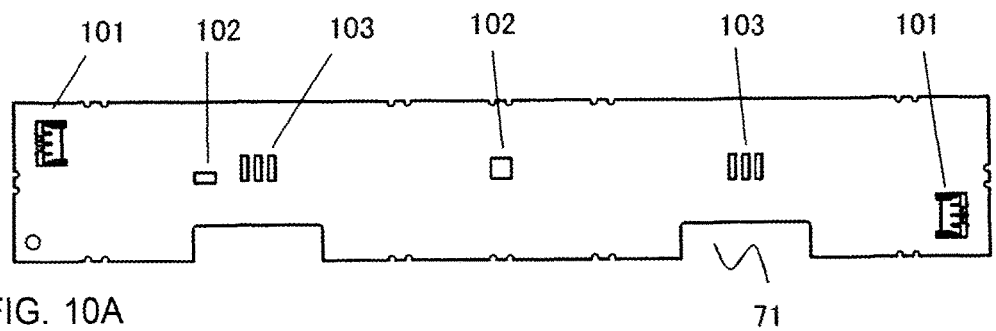
FIG. 10A
BACK SURFACE-SIDE MAIN SURFACE (CIRCUIT SURFACE)
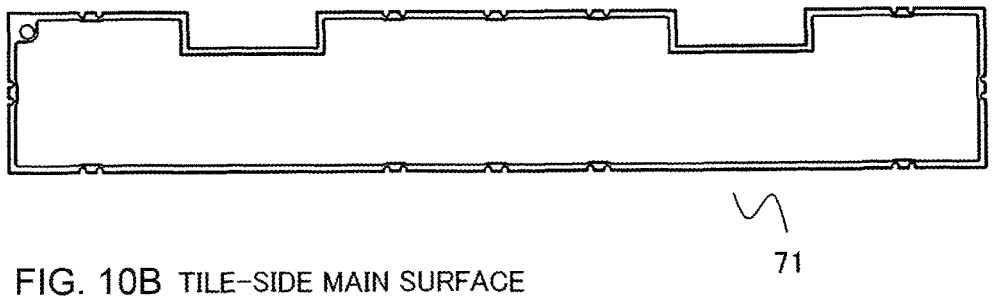
FIG. 10B TILE-SIDE MAIN SURFACE
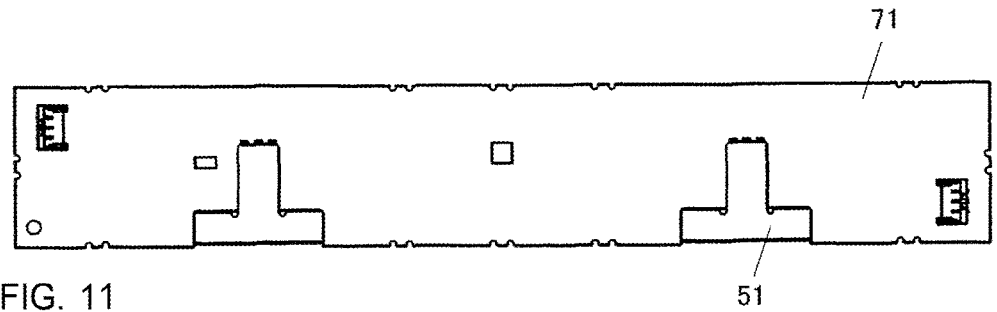
FIG. 11

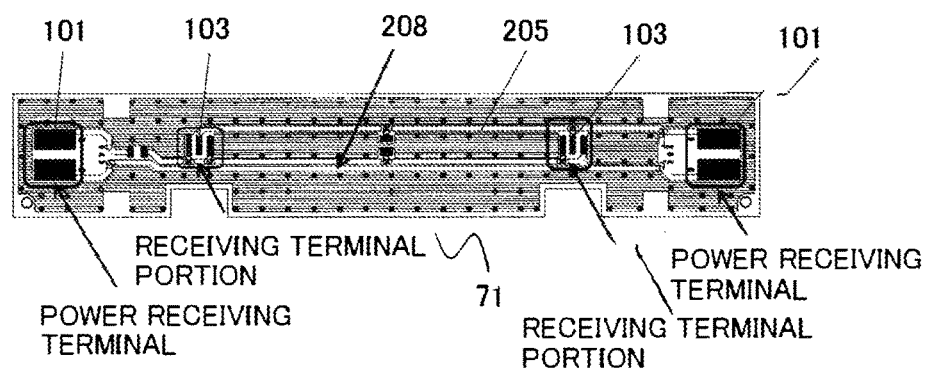
FIG. 14B  BACK SURFACE-SIDE MAIN SURFACE (CIRCUIT SURFACE)
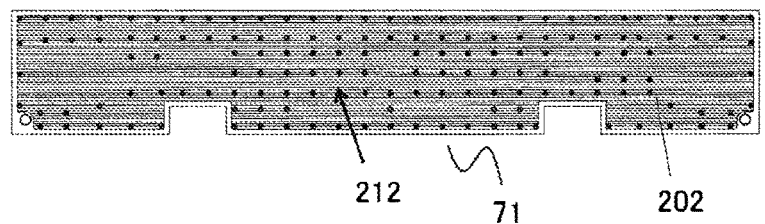
FIG. 14A  TILE-SIDE MAIN SURFACE FIG. 16
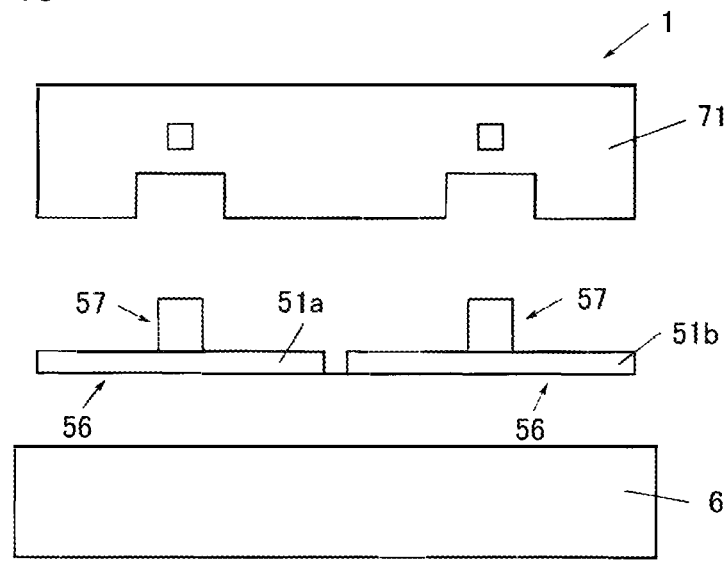
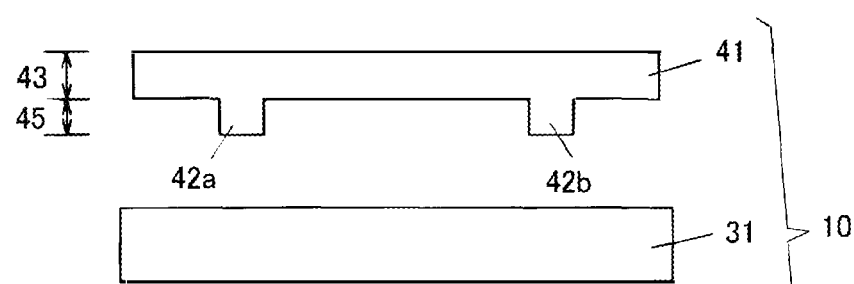
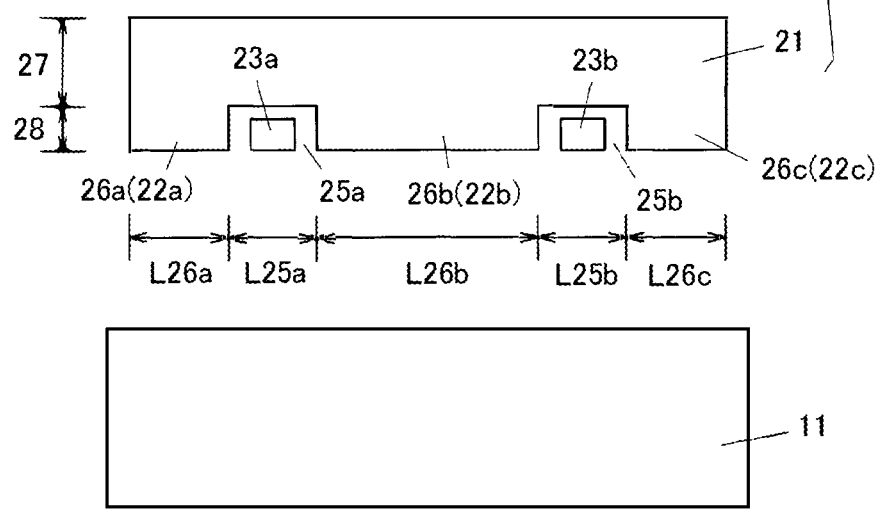

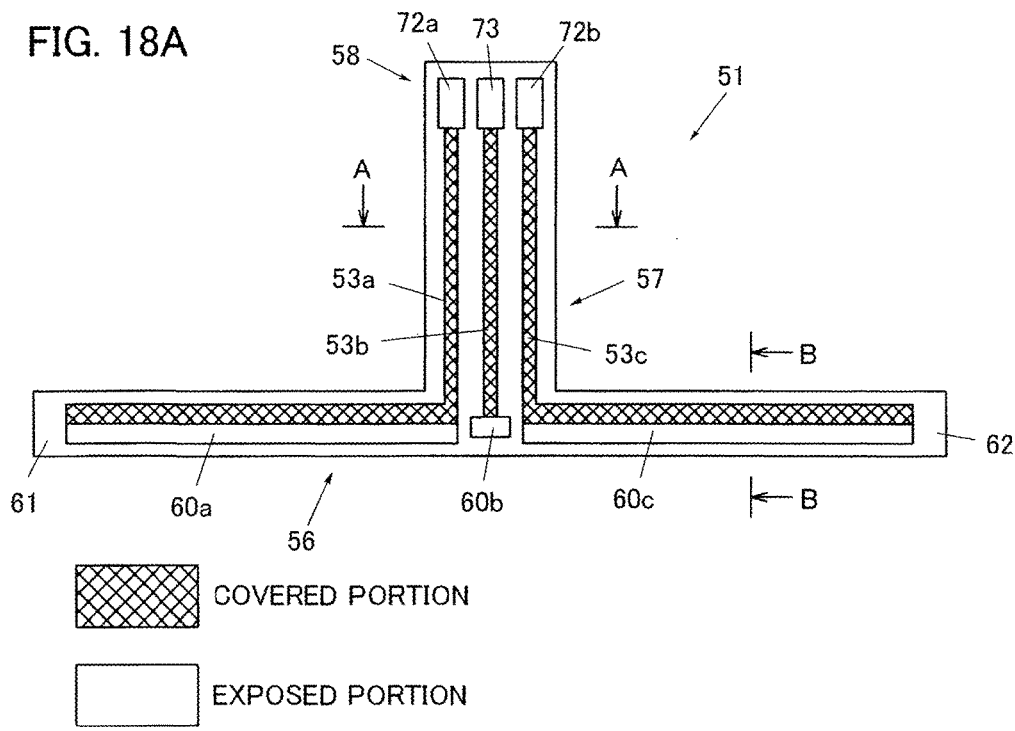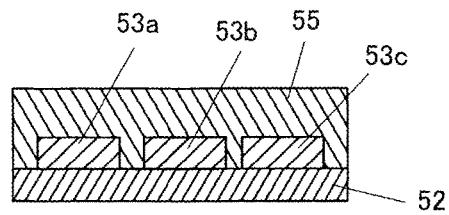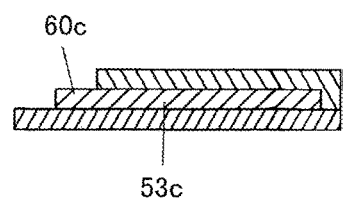

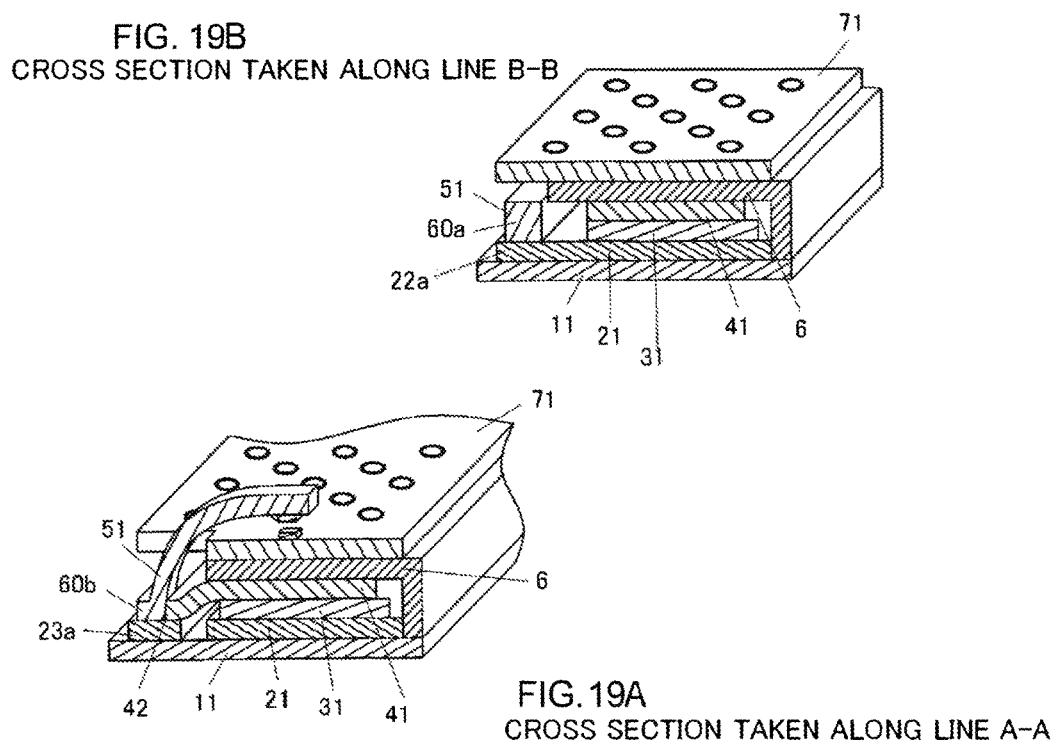

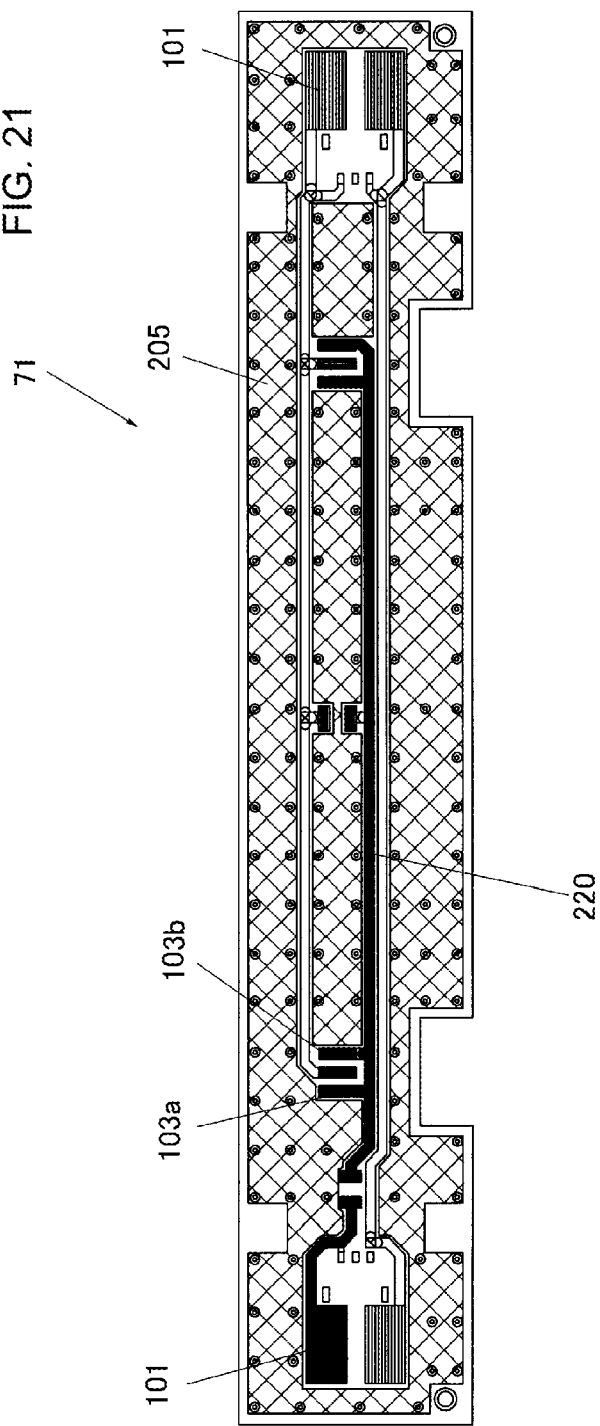

LIGHT-EMITTING MODULE

TECHNICAL FIELD

The present invention relates to a light-emitting module, and particularly to a light-emitting module in which a planar light-emitting tile is provided with a casing.

BACKGROUND ART

In recent years, as an illumination apparatus replacing an incandescent lamp or a fluorescent lamp, an organic EL module has been receiving attention and many studies have been conducted. Here, an organic EL module refers to a thin organic EL tile that emits light in a planar manner and is housed in a housing such as a bezel (a case, a frame). The terms such as an organic EL tile or panel as used herein are defined in International Standard IEC62868.

An organic EL tile is obtained by forming an organic EL element on a substrate such as a glass substrate or a substrate formed by a transparent resin film/metal sheet. The organic EL element is made up of a pair of electrodes one or both of which are light pervious and oppose to each other, and functional layers (light-emitting functional layers) laminated between the pair of electrodes.

In many cases, an organic EL tile is sealed with a sealing glass cap having a recess, or a sealing film such as an inorganic insulating film of Sift or SiN deposited on the organic EL element, or an organic insulating film such as an acrylic insulating film.

When power is applied across the electrodes of an organic EL element, electrically excited electrons and holes are recombined with each other in the organic EL element, allowing the organic EL tile to emit light. That is, an organic EL tile is a device characterized in being thin, lightweight, and emitting light in a planar manner.

A planar light-emitting tile also refers to, in addition to the above-described organic EL tile, an LED tile which is obtained by arranging LEDs in a planar manner or combining an LED and a diffusing plate. That is, a planar light-emitting tile generally refers to a planar light-emitting member, including the organic EL tile.

In order for a planar light-emitting tile represented by an organic EL tile to be used as an illumination device, a power supply circuit and power supply lines for connecting the electrodes of the planar light-emitting tile and any external power supply are necessary. In some cases, a printed circuit board (PCB) such as an FPC (flexible printed circuit) or an RPC (rigid printed circuit) is used as the power supply circuit or the power supply lines.

Further, as described above, an organic EL tile has a substrate such as a glass substrate. Therefore, it is necessary to prevent any break or crack of the substrate, and any injury to the user's finger touching the end part (edge) of the substrate.

Accordingly, in some cases, an organic EL tile and a housing are combined to each other as a module, and introduced in this state to the market as an illumination device.

That is, any housing (casing) is provided to an organic EL tile, and combined with each other as an organic EL module. In this state, the organic EL module is introduced to the market as an illumination device.

Meanwhile, an illumination device structured by a light-emitting module such as the combined organic EL module or the like cannot provide any novel and effective value to the world if it fails to fully exhibit the characteristics of the planar light-emitting tile such as an organic EL tile, that is, being thin, lightweight, emitting light in a planar manner and the like.

Further, in order to improve the light-emitting efficiency, lifetime, and reliability of a combined light-emitting module, heat dissipation or soaking must be promoted. With an LED tile that attains high temperatures in emitting light, the heat problem is significant and heat dissipation or soaking must be achieved.

As method and structure for providing a casing, Patent Document 1 discloses a scheme of holding an organic EL tile with a frame having a flange. The scheme is intended to achieve a reduction in thickness with a simple structure.

Patent Document 2 discloses a scheme of reducing a heat emission amount by providing a second electrode that is in contact with one of electrodes provided on opposite sides of a thin film organic light-emitting layer of an organic EL tile.

Patent Document 3 discloses a structure in which elongated organic EL modules are disposed in parallel in the longitudinal direction.

PRIOR ART DOCUMENTS

Patent Documents

Patent Document 1: JP 2011-3512 A
Patent Document 2: JP 2002-50468 A
Patent Document 3: JP 2007-324063 A

DISCLOSURE OF INVENTION

Technical Problem

Meanwhile, Patent Document 1 does not explicitly show the method of fixing the organic EL tile to the frame. The organic EL tile cannot be retained when the light-emitting surface of the module is oriented to be faced up.

Further, in employing the structure disclosed in Patent Document 2, elaborate works are required for the second electrode being in contact with the electrode, which is costly. Further, the structure disclosed in Patent Document 2 requires accuracy in assembly.

Still further, Patent Document 3 is silent about the structure as to heat dissipation, and is associated with a problem of a reduction in lifetime due to heat.

The present invention is made in view of the problems in the conventional techniques, and an object of the present invention is to provide, in a simple and cost-effective manner, an organic EL module with reduced risk of injury from the edge of the substrate of a planar light-emitting tile, capability of being installed in any orientation, light-weight and thinness, and reliability for a long period.

Solution to Problem

The inventors of the present invention has conducted thorough study in view of the problems described above, and found the following results.

(1) Providing fold-in parts to a bezel (a frame-like metal housing) for protecting the edge of a planar light-emitting tile allows the planar light-emitting tile to be combined smoothly, whereby the light-emitting module can be assembled easily. Further, just a single bezel can surely protect the edge of the planar light-emitting tile and support the same. Thus, with the reduced costs of manufacture and assembly, the light-emitting module can be fabricated cost-effectively.

(2) Power is supplied to the planar light-emitting tile via a printed circuit board, and the printed circuit board is combined with the light-emitting module. The printed circuit board has a non circuit surface and a circuit surface. The non circuit surface of the printed circuit board is a full-metal layer. That is, the printed circuit board having a metal layer on its entire one surface is employed.

That is, the structure of the light-emitting module includes the printed circuit board. The printed circuit board whose tile-side main surface is a non circuit surface composed of the full-metal layer is bonded to the planar light-emitting tile back-to-back with each other. That is, the full-metal layer of the printed circuit board is bonded to the back surface of the planar light-emitting tile.

With this structure having high thermal conductivity of the full-metal layer formed on the printed circuit board, the in-plane heat distribution becomes uniform, and light-emission luminance distribution becomes uniform.

(3) By disposing lots of through holes passing through both the surfaces of the printed circuit board, heat is dissipated through the through holes to the back surface-side main surface which is the circuit surface. Thus, a reduction in lifetime due to heat of the light-emitting element can be alleviated.

(4) Setting the position of the fold-in parts of the bezel, a heat dissipation space can be formed over the mounted surface. Thus, heat dissipation property improves.

The inventors have extensively studied the structures in which the effects described above work synergistically without counteracting each other, and by which a compact light-emitting module is obtained cost-effectively. Thus, the inventors has made the present invention.

A first aspect of the present invention based on the above-described finding provides a light-emitting module that includes: a bezel; a planar light-emitting tile having a predetermined light-emitting region at least on a front surface side thereof; and a printed circuit board, wherein the planar light-emitting tile and the printed circuit board are installed in the bezel with the printed circuit board on a back surface side of the planar light-emitting tile, wherein the printed circuit board includes: a base substrate; a tile-side metal layer on a planar light-emitting tile side of the base substrate; and a plurality of through holes connecting the tile-side metal layer to an other surface side of the base substrate, wherein the bezel includes: a rim part having an opening; and a leg part having a leg part body that supports the rim part in mid-air, wherein the printed circuit board is located in a region surrounded by the leg part body, wherein a height H of the leg part body is greater than a total thickness of the planar light-emitting tile and the printed circuit board, and wherein a space formed over a back surface side of the printed circuit board is at least ¼ of the height H of the leg part body.

Desirably, a height h of the space over the back surface side of the printed circuit board is not less than H/4 and not more than 3H/4, H being the height of the leg part body.

Further, other aspect of the present invention provides a light-emitting module that includes: a bezel that includes a rim part surrounding a radiation opening, the rim part having a thickness T; a printed circuit board including a plurality of through holes; and a planar light-emitting tile having a light-emitting region on a light-emitting main surface thereof, wherein the planar light-emitting tile is interposed between the rim part and the printed circuit board, wherein light of the light-emitting region is radiated from the radiation opening of the rim part, wherein the bezel further including: a predetermined abutting part being in contact with the planar light-emitting tile; and a leg part extending in a direction perpendicular to the planar light-emitting tile, the leg part having a height (T+H) including the thickness T of the rim part and integrated with the rim part, wherein the printed circuit board further including: a tile-side metal layer located on a planar light-emitting tile side of the printed circuit board, the tile-side metal layer covering substantially the light-emitting region completely when seen in a plan view, the tile-side metal layer having tile-side through hole openings that are openings of the plurality of through holes; and back surface-side through hole openings located on a back surface side that is opposite side to the planar light-emitting tile side, the back surface-side through hole openings being openings of the plurality of through holes, and wherein the printed circuit board is supported by part of the bezel at a position H/4 to 3H/4 in a direction from the abutting part to an end of the leg part.

That is, the present aspect provides a light-emitting module that includes: a bezel having a rim part having a thickness of T; a printed circuit board having a plurality of through holes; and a planar light-emitting tile having a light-emitting region at its light-emitting main surface. The planar light-emitting tile is held between the rim part and the printed circuit board. The light-emitting module radiates light of the light-emitting region from the light-emitting surface side. The tile is in contact with an abutting part of the bezel. The bezel surrounds a radiation opening corresponding to the light-emitting region and relating to the radiation. The bezel has the rim part that has the abutting part, and a leg part that has a height T+H and extends perpendicularly to the tile, the leg part being continuous to the rim part and integrally formed. The printed circuit board is supported by the bezel at a position (¼)*H to (¾)*H in a direction from the abutting part to an end of the leg part. The printed circuit board includes a tile-side main surface that is a tile-side main surface on the tile side, includes substantially the entire light-emitting region as seen in a plan view, and includes a metal layer that includes tile-side through hole openings being openings of the plurality of through holes. The printed circuit board further includes a back surface-side main surface on the opposite side of the tile-side main surface, the back surface-side main surface including back surface-side through hole openings being openings of the plurality of through holes.

In the present aspect, the planar light-emitting tile is preferably an organic EL tile. In this manner, the light-emitting module according to the present aspect includes the bezel having the leg part having an inner height H, the planar light-emitting tile, and the printed circuit board having a plurality of heat-dissipating through holes.

The light-emitting module according to the present aspect is a light-emitting module that includes an space for heat dissipation between the printed circuit board and the mounted surface, in which the printed circuit board includes a tile-side main surface which is a soaking metal layer including through hole openings.

The present aspect provides, in a simple and cost-effective manner, the light-emitting module being reduced in thickness as a whole, with its substrate end ensuring shock resistance and low risk of injury, and being excellent in soaking and dissipation characteristics.

In each of the above-described aspects, desirably, the tile-side metal layer of the printed circuit board has an area not less than 70 percent of an area of the light-emitting region of the planar light-emitting tile, the printed circuit board further including a heat dissipation-side metal layer on the back surface side thereof, the heat dissipation-side metal layer being connected to the tile-side metal layer via the through holes, and the heat dissipation-side metal layer has an area not less than 60 percent of the area of the light-emitting region of the planar light-emitting tile.

Further, preferably, the leg part further including a fold-in part partly along an end part thereof, the fold-in part supporting the printed circuit board.

According to the present aspect, the light-emitting module can be manufactured simply and cost-effectively.

Further, preferably, the leg part has a notch part for storage or passage of an external power supply line supplying the printed circuit board with power from an external source, the notch part being recessed from an end of the leg part toward the rim part partly in the leg part.

According to the present aspect, the light-emitting module being excellent in stability in attaching the module and in appearance in the attaching can be manufactured simply and cost-effectively.

Further, preferably, each of the two short side leg parts including the notch part.

That is, preferably, the light-emitting module has an elongated quadrangular outer shape in which a length is greater than a width, wherein the bezel includes: the rim part having a quadrangular outer shape with two long sides and two short sides; two long side leg parts; and two short side leg parts, the two long side leg parts and the two short side leg parts being perpendicular to the rim part.

According to the present aspect, two or more organic EL modules can be connected to each other by their respective short sides. This realizes structuring an elongated light-emitting system as a whole.

According to the present aspect, while the interval between the modules, that is, the non light-emitting region between the modules is kept to be narrow, an elongated light-emitting system can be structured with simple electrical connection. Further, the bezel employed in the present aspect allows the fold-in part and the notch part to be disposed respectively at separate leg parts of the bezel. Thus, the bezel can be manufactured cost-effectively without reducing its strength, and is an excellently productive bezel.

Further, preferably, the module has an elongated quadrangular outer shape in which a length of the module is greater than a width of the module. The bezel includes: the rim part having a quadrangular outer shape with two long sides and two short sides; two long side leg parts; and two short side leg parts, the two long side leg parts and the two short side leg parts being perpendicular to the rim part.

The present aspect provides the light-emitting module being excellent in stability in attaching the module to the bezel and in appearance in the attaching.

Each of the above-described aspects further includes, preferably, a power receiving terminal that is connected to an external power supply line on the back surface side of the printed circuit board. More preferably, the power receiving terminal is a connector. According to the present aspect, two or more light-emitting modules can be connected with ease.

Further, each of the above-described aspects further includes, preferably, a protective circuit and/or a dimming circuit on the back surface side of the printed circuit board.

The present aspect implements the light-emitting module in a compact structure, with added values of module protection and module lighting adjustment.

Further, each of the above-described aspects further includes, preferably, a wiring member that electrically connects the planar light-emitting tile and the printed circuit board, the wiring member including a terminal portion having a terminal connected to the printed circuit board, wherein a receiving terminal is disposed on the back surface side of the printed circuit board, the receiving terminal being connected to the terminal of the wiring member.

Effect of Invention

The light-emitting module of the present invention is a thin and lightweight light-emitting module, has a proper edge protection function, and has a planar light-emitting tile reinforced with a printed circuit board.

Further, the light-emitting module of the present invention can be installed in any orientation. Still further, the light-emitting module of the present invention exhibits uniform in-plane heat distribution, is thermally excellent, and is suitable for production.

BRIEF DESCRIPTION OF DRAWINGS

FIGS. 9A and 9B are external views of the wiring member 51 employed in Example.

FIGS. 10A and 10B are external views of the printed circuit board 71 employed in Example.

FIG. 11 is a non light-emitting surface-side external view of the printed circuit board 71 employed in Example.

FIGS. 14A and 14B are detailed external views of the printed circuit board 71 according to Example in which an exemplary printed circuit board 71 of the present invention is used, wherein FIG. 14A is a plan view showing the surface mounted onto the planar light-emitting tile side, and FIG. 14B is a bottom view showing the back surface side thereof.

FIG. 16 is an explanatory diagram in which patterns of layers of the module body are shown in a planar manner and in order.

FIG. 18A is a front view observing the wiring member from the electrode exposed side.

FIG. 18B is a cross-sectional view taken along line A-A in FIG. 18A.

FIG. 18C is a cross-sectional view taken along line B-B in FIG. 18A.

FIG. 19A is a cross-sectional perspective view of the module body showing a cross section taken along line A-A.

FIG. 19B is a cross-sectional perspective view of the module body showing a cross section taken along line B-B in FIG. 7.

FIG. 21 is a bottom view of the printed circuit board shown in FIGS. 14A and 14B, in which an anode connecting line is painted black.

FIGS. 26A and 26B are cross-sectional views taken along line A-A in FIG. 5, wherein FIG. 26A shows the state before tongue parts are folded, and FIG. 26B shows the state in which the tongue parts are folded to form fold-in parts.

BEST MODE FOR CARRYING OUT THE INVENTION

Prior to a detailed description of the constituents, a description will be given of the overview of a light-emitting module 100 according to an embodiment of the present invention.

Figure 7:
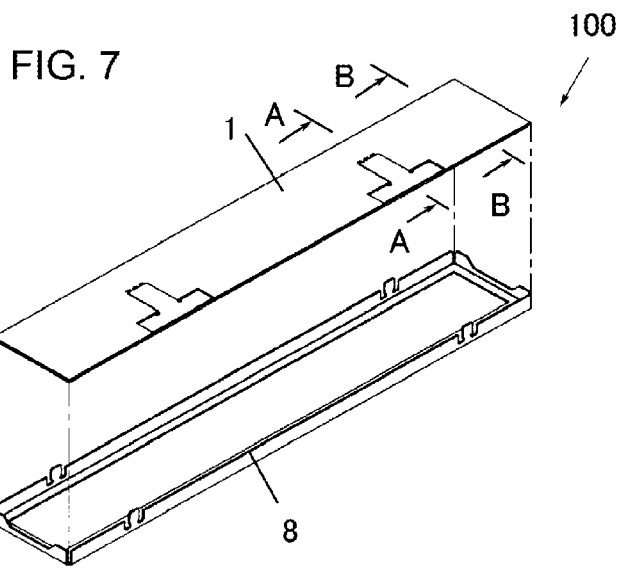
FIG. 7 is an exploded perspective view showing the light-emitting module 100 according to one embodiment of the present invention.
Figure 15:
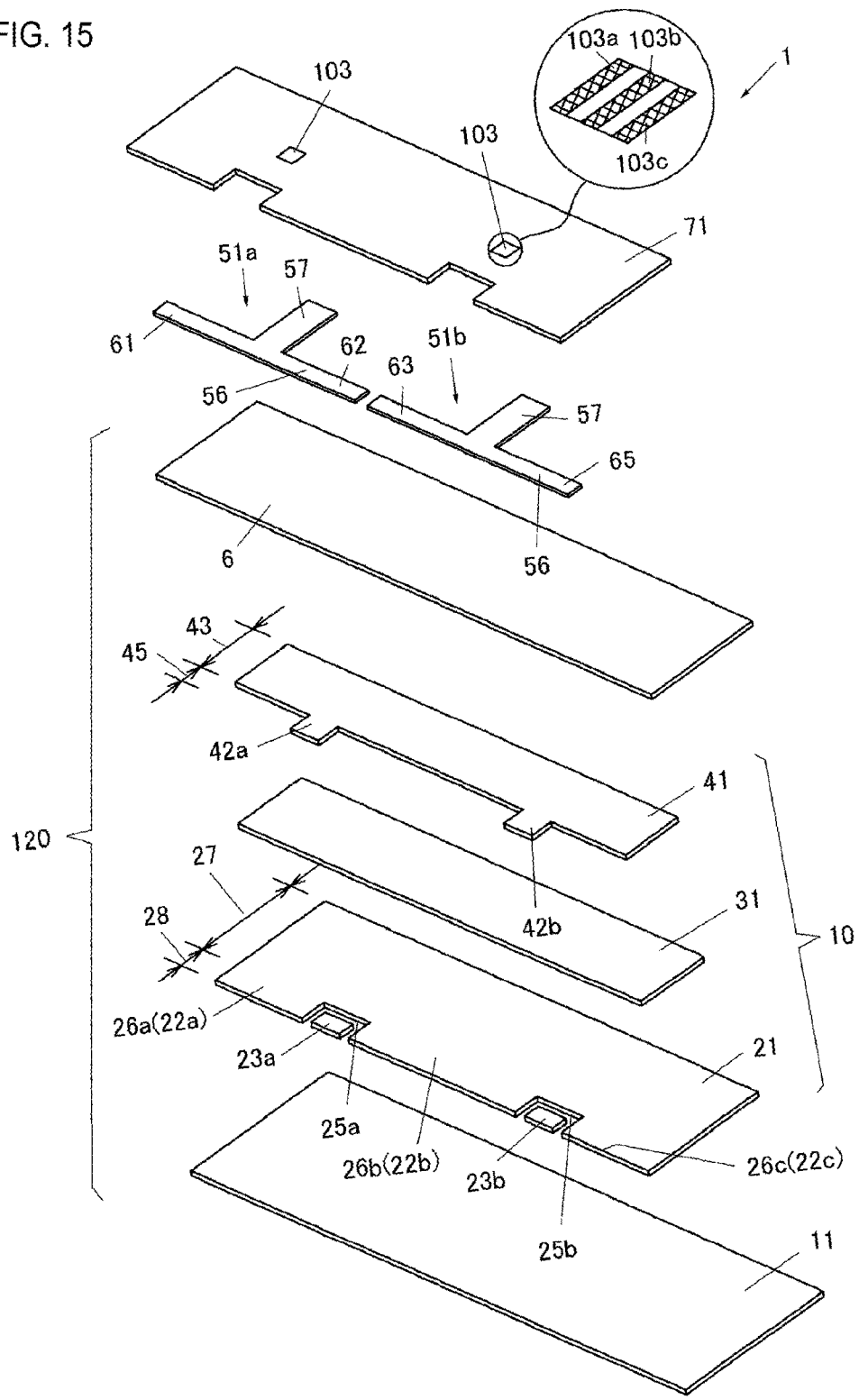
FIG. 15 is an exploded perspective view showing virtually exploded layers of the module body.

As shown in FIG. 7, the light-emitting module 100 according to the present embodiment is structured by a module body 1 and a bezel 8. Further, as shown in FIG. 15, the module body 1 is structured by a planar light-emitting tile 120, a printed circuit board 71, and a wiring member 51.

The bezel 8 is a frame that houses the module body 1. The bezel 8 shown in FIG. 5 has a rim part 81 and a leg part 84. A bezel 18 shown in FIG. 12 further has attaching flanges 75 at the leg part 84. The bezel 8 and the bezel 18 are different from each other just in the attaching flanges 75.

Figure 5:
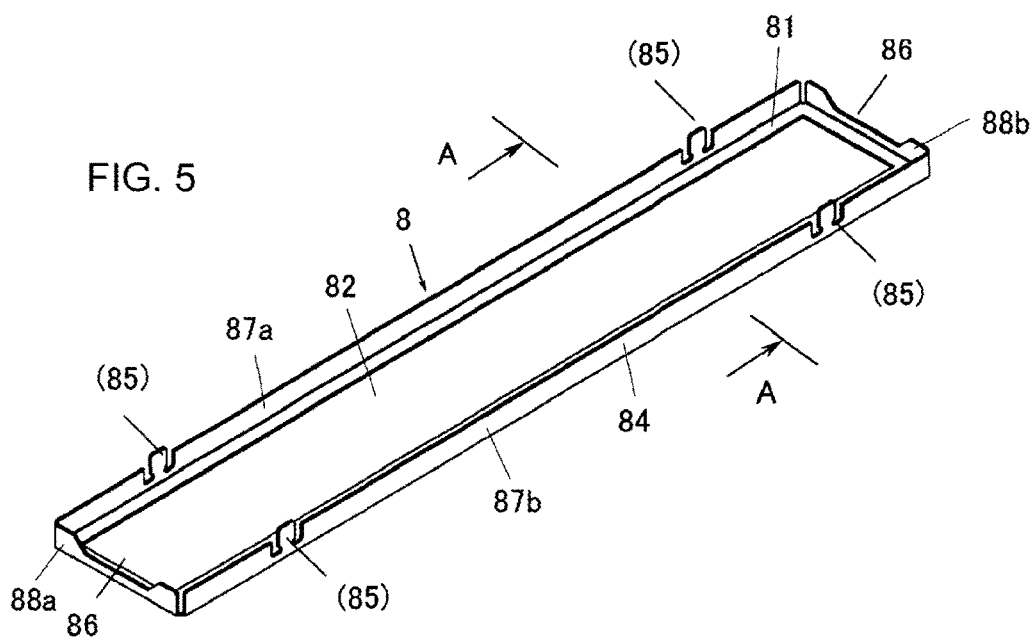
FIG. 5 is a perspective view showing an exemplary bezel 8 of the present invention.

In the following, a description will be given of the bezel 8 shown in FIG. 5 representative of the bezels 8, 18.

Figure 8:
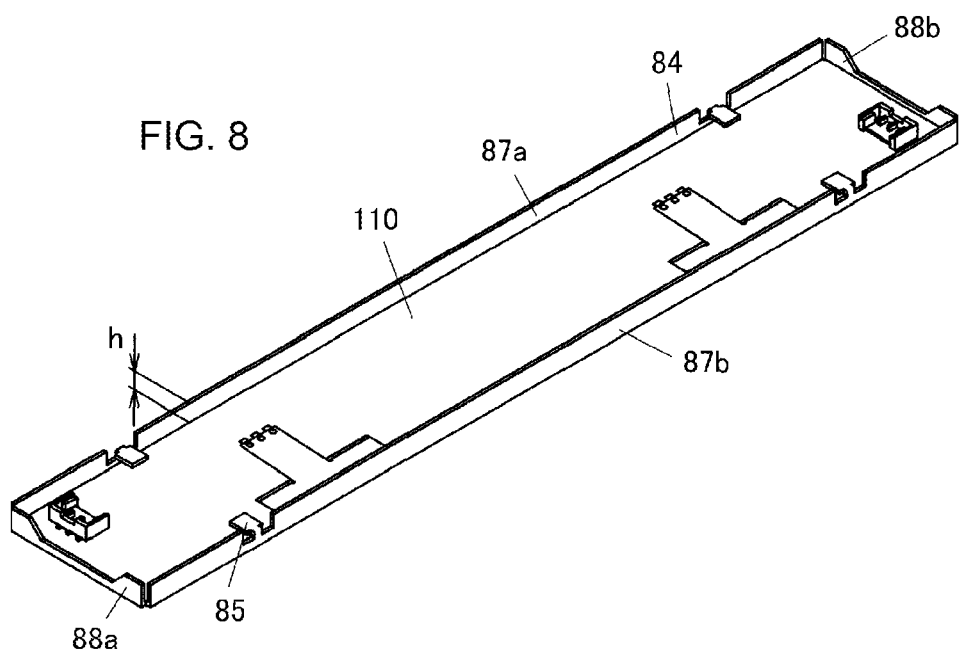
FIG. 8 is a perspective view showing the light-emitting module 100 according to one embodiment of the present invention.

In the present embodiment, the bezel 8 is formed by bending a thin metal plate or the like. As shown in FIGS. 5 and 8, the bezel 8 has the frame-like rim part 81 having a large opening (radiation opening) 82, and the leg part 84 folded perpendicularly to the rim part 81.

The shape of the bezel 8 as seen in a plan view is rectangular, and the opening (radiation opening) 82 is also rectangular.

A thickness T of the rim part 81 itself is about 0.3 mm to 1.0 mm.

The leg part 84 is integrated with the rim part 81, and a height H of a leg part body (FIGS. 1 and 26) 80 is from 2 mm to 10 mm.

As shown in FIG. 5, the leg part 84 is on the back surface side of the rim part 81, and wall-like projecting perpendicularly from the four sides of the rim part 81. As described above, the bezel 8 is rectangular, and has parallel two long sides and parallel two short sides. Accordingly, the leg part 84 includes leg parts 87a, 87b along the long sides, and leg parts 88a, 88b along the short sides.

The leg part body 80 is a portion attached to the wall, ceiling, floor or the like of a building or any other structure. Whatever the attaching orientation is, the leg part body 80 keeps the rim part 81 to be spaced apart from the building or the like. That is, the leg part body 80 supports the rim part 81 in the air.

In the present embodiment, the leg parts 87a, 87b along the long sides are each provided with two fold-in parts 85.

Figure 26A:
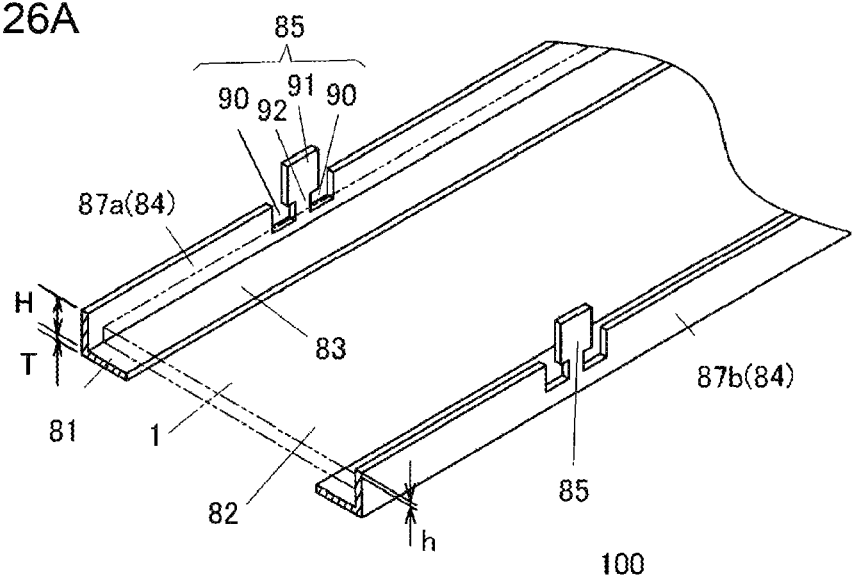
Figure 26B:
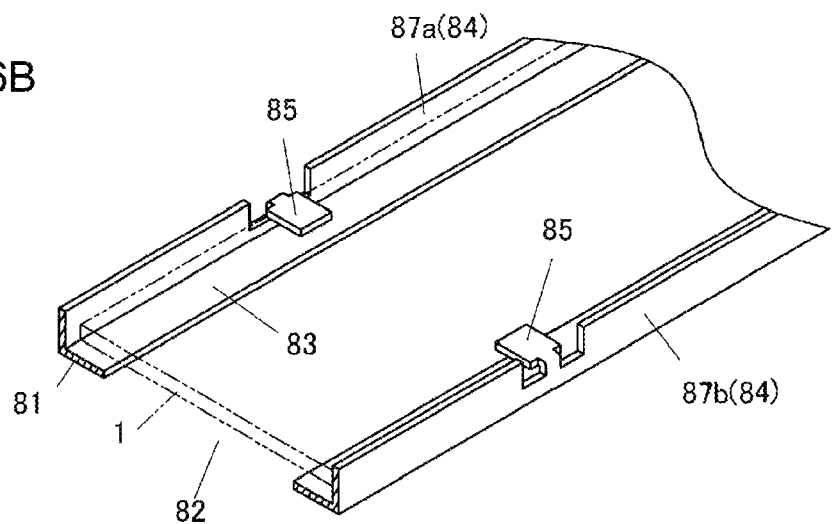

As shown in FIG. 26A, the fold-in parts 85 are formed as follows. Two slits 90 are provided from the free end of each of the leg parts 87a, 87b toward the rim part 81 to form a tongue part 91. As shown in FIG. 26B, the tongue parts 91 are folded inward relative to the leg parts 87a, 87b, to form the fold-in parts 85.

The height of the free end of each tongue part 91 before being folded is higher than that of the leg parts 87a, 87b. A neck part 92 having a narrow width is provided on the basal end side of each tongue part 91.

Further, a notch part 86 is provided to each of the leg parts 88a, 88b along the short sides of the leg part 84 (FIG. 5).

In the present embodiment, while the leg part 84 projects perpendicularly from the four sides of the rim part 81, the projecting direction is not necessarily perpendicular to the rim part 81. The projecting direction having a perpendicular component will suffice.

In the present embodiment, the planar light-emitting tile 120 is an organic EL tile.

As shown in FIG. 15, the planar light-emitting tile 120 is formed as follows. An organic EL element 10 is laminated on a glass substrate 11. Further, a sealing layer 6 is layered on the organic EL element 10.

That is, the planar light-emitting tile 120 is a light-emitting member.

The module body 1 is formed of the planar light-emitting tile 120 to which the printed circuit board 71 and the wiring member 51 are attached. The module body 1 is a member that includes the planar light-emitting tile 120 on which electrical components are mounted. In other words, the module body 1 is an assembly capable of causing the planar light-emitting tile 120 to emit light when connected to an external power supply.

The light-emitting module 100 is a member formed of the module body 1 installed in the bezel 8, and capable of being attached to the wall or the ceiling. It can be said that the light-emitting module 100 is a member having a function of an illumination device.

The module body 1 is mounted on the back surface of the bezel 8. That is, the module body 1 is disposed in the space surrounded by the rim part 81 of the bezel 8, the leg parts 87a, 87b along the long sides, and the leg parts 88a, 88b along the short sides.

Note that, in the present embodiment, the leg part body 80 is wall-like, and the module body 1 is fully encased in the space surrounded by the wall. However, the leg part 84 is not limited to be wall-like. For example, like legs of a table, a portion connected to the rim part 81 may be greater in area than the portion connected to the rim part 81.

In this case also, assuming that virtual walls connect the leg part bodies 80, the module body 1 is set in the region surrounded by the leg part bodies 80.

The area around the outer circumference of the front surface (light-emitting side) of the light-emitting module 100 is in contact with the back surface (an abutting part 83) of the rim part 81. Further, the side surface of the light-emitting module 100 is surrounded by the boundary between the rim part 81 and the leg part body.

The back surface of the light-emitting module 100 is supported by the fold-in parts 85 of the bezel 8.

That is, the light-emitting module 100 has its edge on the front surface side supported by the abutting part 83 formed of the back surface of the rim part 81, and has a back surface side supported by the fold-in parts 85 of the bezel 8.

That is, the light-emitting module 100 is clamped between the abutting part 83 of the rim part 81 and the fold-in parts 85 of the leg part, and fixed in the front-back surface direction.

Further, the circumferential surface of the light-emitting module 100 is surrounded by the boundary between the rim part 81 and the leg part body 80, and thus the light-emitting module 100 is restricted from shifting also in the lateral direction.

The light-emitting module 100 is positioned toward the rim part 81 side in the bezel 8. Further, the thickness of the light-emitting module 100 is smaller than the total height "T+H" of the bezel 8.

Therefore, the light-emitting module 100 is spaced apart from a building or the like and held in the air by the leg part body 80.

Accordingly, there exists a space 110 having a height h, on the back surface side of the light-emitting module 100.

As will be described later, the printed circuit board 71 is positioned on the most back surface side of the light-emitting module 100, and the printed circuit board 71 is supported by the fold-in parts 85 of the leg part 84.

The position on the most back surface side of the printed circuit board 71 is ¼ to ¾ as great as the height H of the leg part body 80. Therefore, on the back surface side of the printed circuit board 71, there exists the space 110 having a height (height h) ¼ to ¾ as great as the height H of the leg part body 80.

As to the dimensional relationship of the constituents, the total height "T+H" of the bezel 8 is from 2 mm to 20 mm, preferably from 2 mm to 10 mm. Most preferably, the total height "T+H" is from 2 mm to 5 mm.

The thickness of the light-emitting module 100 is from 1 mm to 5 mm, preferably from 1 mm to 3 mm, and more preferably less than 3 mm.

The height h of the space 110 formed on the back surface side of the printed circuit board 71 is from 0.5 mm to 18 mm. Note that, the height h of the space 110 is preferably from 1.0 mm to 5 mm, and most preferably from 1.0 mm to 3 mm. Note that, the height h of the space 110 is the height from the free end of the leg part body 80 to the base portion of the printed circuit board 71, without taking into consideration of any terminals, connectors, ICs and the like mounted on the printed circuit board 71.

In the case where the height H of the leg part body 80 is great, the height h of the space 110 becomes great. Further, in the case where the height H of the leg part body 80 is small, the height h of the space 110 becomes small.

In the case where the height H of the leg part body 80 is small and the height h of the space 110 is excessively small, the heat dissipation space becomes narrow, containing heat inside and reducing the heat dissipation effect. Further, in the case where the height H of the leg part body 80 is high and the height h of the space 110 is excessively high, the characteristic of the organic EL panel, which is small in thickness, cannot be fully exhibited.

Figure 24:
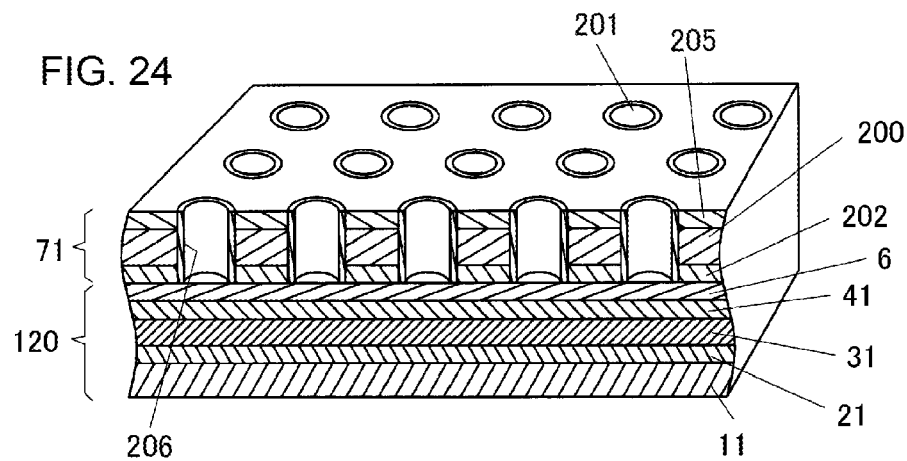
FIG. 24 is an enlarged cross-sectional view of a module body.

The light-emitting module 100 according to the present embodiment includes a metal layer on each of the front and back surfaces of the printed circuit board 71. More specifically, as shown in FIG. 24, a tile-side metal layer 202 is provided on the front surface, and a heat dissipation-side metal layer 205 is provided on the back surface. The tile-side metal layer 202 and the heat dissipation-side metal layer 205 are connected to each other via through holes 201, whereby heat is transferred between the tile-side metal layer 202 and the heat dissipation-side metal layer 205.

In the light-emitting module 100 according to the present embodiment, the tile-side metal layer 202 of the printed circuit board 71 is in contact with the back surface of the planar light-emitting tile 120, and the tile-side metal layer 202 absorbs heat of the planar light-emitting tile 120. Then, the heat is transferred to the heat dissipation-side metal layer 205 on the back surface side of the printed circuit board 71.

By virtue of the great area of the heat dissipation-side metal layer 205 and presence of the space 110 formed on the back surface side of the printed circuit board 71, heat of the heat dissipation-side metal layer 205 is dissipated into the space 110, whereby heat of the planar light-emitting tile 120 is released to the outside.

Next, a description will be sequentially given about the overview of the members of the light-emitting module 100.

Figure 17:
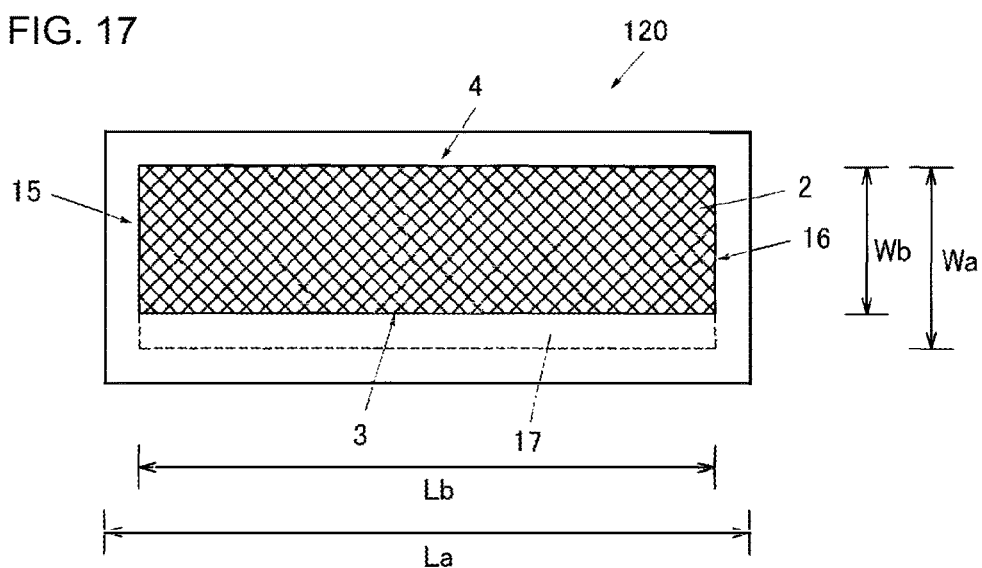
FIG. 17 is a plan view showing the state where the planar light-emitting tile is emitting light.

Firstly, a description will be given about the planar light-emitting tile 120. As shown in FIG. 17, the planar light-emitting tile 120 has a greater total length La relative to a width Wa, and is elongated.

As shown in FIG. 17, a light-emitting region 2 of the planar light-emitting tile 120 is planar and rectangular. The light-emitting region 2 has a greater total length Lb relative to a width Wb, and is elongated.

The width Wb of the light-emitting region 2 is not more than ⅓ of the total length Lb of the light-emitting region 2. More desirably, the width Wb is not more than ⅕ of the total length Lb, and further desirably ⅛ as great as or smaller than the total length Lb.

Further, the width Wb of the light-emitting region 2 is narrow and not longer than 5 cm. More desirably, the width Wb of the light-emitting region 2 is not longer than 3 cm. More preferably, the width Wb of the light-emitting region 2 is not loner than 2 cm.

The total length Lb of the light-emitting region 2 is not smaller than 5 cm, and more desirably not smaller than 10 cm.

As described above, the light-emitting region 2 of the planar light-emitting tile 120 is rectangular, and surrounded by the parallel long sides 3, 4 and the parallel short sides 15, 16.

In the present embodiment, as shown in FIG. 17, the power supply part 17 for the light-emitting region 2 is centrally positioned on one long side 3 of the light-emitting region 2.

The planar light-emitting tile 120 is an organic EL panel of the bottom emission type, in which the organic EL element 10 is laminated on the glass substrate 11 as shown in FIGS. 15 and 16. Further, in the present embodiment, the organic EL element 10 is sealed by the sealing layer 6.

As described above, in the module body 1 according to the present embodiment, the printed circuit board 71 is attached to the sealing layer 6 of the planar light-emitting tile 120, and further the wiring member 51 connects the printed circuit board 71 and the organic EL element 10. In the present embodiment, the wiring member 51 is a flexible printed wiring.

As described above, the planar light-emitting tile 120 is formed by the glass substrate 11 on which the organic EL element 10 is laminated.

As shown in FIGS. 15 and 16, the organic EL element 10 has a transparent conductive anode layer 21, which is a transparent electrode layer, and the metal cathode layer 41, which is a metal layer, and a functional layer (light-emitting functional layer) 31 is interposed between them.

As shown in FIGS. 15 and 16, in the present embodiment, the transparent conductive anode layer 21 is substantially rectangular as seen in a plan view, and has recesses and projections along one long side of the rectangle. Specifically, as shown in FIGS. 15 and 16, the transparent conductive anode layer 21 has notch parts 25a, 25b at two portions along one long side. In other words, the transparent conductive anode layer 21 has projecting parts 26a, 26b, 26c at three portions along one long side.

The transparent conductive anode layer 21 is functionally separated into an anode layer body region 27 that functions as an electrode, and the other area, a pad region 28.

The anode layer body region 27 is a rectangular region other than the notch parts 25a, 25b and the projecting parts 26a, 26b, 26c.

The pad region 28 is a region where the projecting parts 26a, 26b, 26c are formed.

The above-described projecting parts 26a, 26b, 26c are transparent electrode-side power supply pad parts, and function as anode-side power supply pad parts 22a, 22b, 22c in the present embodiment.

Since the projecting parts 26a, 26b, 26c are connected to the transparent conductive anode layer 21, they can be referred as transparent electrode-side power supply pad parts. Viewing polarity of the electrode, the projecting parts 26a, 26b, 26c function as anode-side power supply pad parts. In the present embodiment, while the names of anode-side power supply pad parts 22a, 22b, 22c are mainly used, the anode-side power supply pad parts 22a, 22b, 22c are also transparent electrode-side power supply pad parts.

The anode-side power supply pad parts 22a, 22b, 22c are part of the transparent conductive anode layer 21. The anode-side power supply pad parts 22a, 22b, 22c are extending parts of the transparent conductive anode layer 21, and function as terminals for energizing the functional layer (light-emitting functional layer) 31.

The shape of the projecting parts 26a, 26b, 26c is rectangular. That is, the projecting parts 26a, 26b, 26c are each elongated and rectangular along the long side 3 of the light-emitting region 2.

The three projecting parts 26a, 26b, 26c are arranged in this order from the left side of the drawing. The notch part 25a is present between the projecting parts 26a, 26b, and the notch part 25b is present between the projecting parts 26b, 26c.

The ends in the longitudinal direction of the opposite projecting parts 26a, 26c are aligned with the end of the anode layer body region 27.

Lengths L26a, L26b, L26c in the longitudinal direction of three projecting parts 26a, 26b, 26c of the planar light-emitting tile 120 are each greater than lengths L25a, L25b of the notch parts 25a, 25b.

The lengths L26a, L26b, L26c of the projecting parts 26a, 26b, 26c in total are not less than 60 percent, more desirably 70 percent, and further more preferably 80 percent the length of the anode layer body region 27.

Since the shape of each projecting parts 26a, 26b, 26c is rectangular, the length of the portions connecting the projecting parts 26a, 26b, 26c with the anode layer body region 27 is equal to the lengths L26a, L26b, L26c of the projecting parts 26a, 26b, 26c.

Accordingly, the length of the portions connecting the projecting parts 26a, 26b, 26c with the anode layer body region 27 is not less than 60 percent, more desirably 70 percent, and further preferably 80 percent of the length of the anode layer body region 27.

In the present embodiment, while the three projecting parts 26a, 26b, 26c are provided along one long side of the anode layer body region 27, they are not identical to one another in length. In the present embodiment, while the opposite projecting parts 26a, 26c are identical to each other in length, the central projecting part 26b is longer than the other two. Specifically, the central projecting part (central anode-side power supply pad part) 26b is about twice as great as the other two in length.

In the present embodiment, cathode-side power supply pad parts 23a, 23b are formed at the positions of the notch parts 25a, 25b. The cathode-side power supply pad parts 23a, 23b are formed simultaneously with the formation of the transparent conductive anode layer 21, and are identical to the transparent conductive anode layer 21 in material and thickness.

The cathode-side power supply pad parts 23a, 23b are named in terms of the polarity of the electrode. In terms of their connection to the metal cathode layer 41, they are metal electrode-side power supply pad parts. In the present embodiment, while the names of cathode-side power supply pad parts 23a, 23b are mainly used, the cathode-side power supply pad parts 23a, 23b are also metal electrode-side power supply pad parts.

The cathode-side power supply pad parts 23a, 23b are island parts that are independent of the transparent conductive anode layer 21. That is, the transparent conductive anode layer 21 is formed island-like, and the cathode-side power supply pad parts 23a, 23b and the transparent conductive anode layer 21 are electrically disconnected from each other.

As shown in FIG. 15, the functional layer (light-emitting functional layer) 31 is laminated on the anode layer body region 27 of the transparent conductive anode layer 21. More specifically, as shown in FIGS. 15 and 16, the functional layer 31 is formed to fully fall within the range of the anode layer body region 27 of the transparent conductive anode layer 21.

The metal cathode layer 41 is further laminated on the functional layer (light-emitting functional layer) 31. As shown in FIGS. 15 and 16, the metal cathode layer 41 is also substantially rectangular as seen in a plan view. The metal cathode layer 41 also has recesses and projections along one long side. However, the positional relationship of the recesses and projections of the metal cathode layer 41 is converse to that of the transparent conductive anode layer 21. In the metal cathode layer 41, projecting extending parts 42a, 42b are provided at portions corresponding to the notch parts 25a, 25b of the transparent conductive anode layer 21.

The metal cathode layer 41 is also functionally separated into a metal cathode layer body region 43 that functions as an electrode, and the other region, a pad region 45.

In the present embodiment, the pad region 45 is a region where the extending parts 42a, 42b are formed. The other region is the metal cathode layer body region 43.

The metal cathode layer body region 43 of the metal cathode layer 41 is overlaid on the functional layer 31, and does not protrude from the functional layer 31.

On the other hand, the extending parts 42a, 42b of the pad region 45 protrude from the functional layer 31. The positions of the extending parts 42a, 42b correspond to those of the notch parts 25a, 25b of the transparent conductive anode layer 21. Accordingly, the extending parts 42a, 42b of the metal cathode layer 41 are overlaid on the cathode-side power supply pad parts 23a, 23b provided to the notch parts 25a, 25b of the transparent conductive anode layer 21.

In the present embodiment, the projecting portions of the extending parts 42a, 42b of the metal cathode layer 41 reach the ends of the cathode-side power supply pad parts 23a, 23b, and the extending parts 42a, 42b of the metal cathode layer 41 partially are overlaid on the cathode-side power supply pad parts 23a, 23b.

Note that, the extending parts 42a, 42b of the metal cathode layer 41 may entirely cover the cathode-side power supply pad parts 23a, 23b.

Next, a description will be given about the wiring member 51.

In the present embodiment, two wiring members 51 are connected to the organic EL element 10 of the planar light-emitting tile 120. The transparent conductive anode layer 21 and the metal cathode layer 41 are energized via the two wiring members 51.

The wiring member 51 shown in FIG. 18A is what is called a flexible printed wiring, in which a resin-made substrate layer 52, a metal conductive layer 53, and a cover layer 55 are layered.

In the wiring member 51, the metal conductive layer 53 is largely covered with the cover layer 55, and part of the metal conductive layer 53 is exposed outside as an electrode.

In the present embodiment, the wiring member 51 is T-shaped, having a horizontally elongated part 56 and a vertically elongated part 57. The vertically elongated part 57 extends in the direction perpendicular to the horizontally elongated part 56, and connected to the center in the longitudinal direction of the horizontally elongated part 56.

The metal conductive layer 53 is separated into three lines. That is, on the substrate layer 52, a left-line metal conductive layer 53a, a middle-line metal conductive layer 53b, and a right-line metal conductive layer 53c are layered.

In the present embodiment, the tip on the free end side of the vertically elongated part 57 functions as a terminal part 58, and the three lines of the metal conductive layer 53 are exposed at the tip on the free end side of the vertically elongated part 57.

In the present embodiment, the three lines of the metal conductive layer 53 are exposed at the terminal part 58, to form an A-side left terminal 72a, a B-side terminal 73, and an A-side right terminal 72b.

Further, in the present embodiment, the horizontally elongated part 56 functions as a pad part, and the three lines of the metal conductive layer 53 are exposed at any portion of the horizontally elongated part 56.

That is, the horizontally elongated part 56 includes an A-side left pad 60a, a B-side pad 60b, and an A-side right pad 60c.

The above-described A-side left terminal 72a is connected to the A-side left pad 60a. The B-side terminal 73 is connected to the B-side pad 60b. The A-side right terminal 72b is connected to the A-side right pad 60c.

Note that, the A-side left pad 60a and the A-side right pad 60c are connected to the anode-side power supply pad parts (transparent electrode-side power supply pad parts) 22a, 22b, 22c. Further, the B-side pad 60b is connected to the cathode-side power supply pad parts (metal electrode-side power supply pad parts) 23a, 23b.

Among the three lines of the metal conductive layer 53, the central middle-line metal conductive layer 53b passes through the center of the vertically elongated part 57, to reach the horizontally elongated part 56. The middle-line metal conductive layer 53b is exposed at the center of the horizontally elongated part 56, to form the B-side pad 60b. The exposed portion (the B-side pad 60b) of the middle-line metal conductive layer 53b is dot-like.

On the other hand, the left-line metal conductive layer 53a extends along the vertically elongated part 57 to reach the horizontally elongated part 56, and further extends along the horizontally elongated part 56 leftward in the drawing. The left-line metal conductive layer 53a is exposed in a region half as great as the width of the horizontally elongated part 56, to form the A-side left pad 60a. The exposed portion (the A-side left pad 60a) of the left-line metal conductive layer 53a is linear and elongated.

The right-line metal conductive layer 53c is symmetric to the left-line metal conductive layer 53a. Similar to the left-line metal conductive layer 53a, the right-line metal conductive layer 53c is linear and elongated.

In the present embodiment, the horizontally elongated part 56 of the wiring member 51 abuts on the pad regions 28, 45 of the transparent conductive anode layer 21 and the metal cathode layer 41.

For the sake of convenience, the projecting parts 26a, 26b, 26c are referred to as a first projecting part 26a, a second projecting part 26b, and a third projecting part 26c, respectively. Further, the two wiring members 51 are separately recognized as a first wiring member 51a, and a second wiring member 51b.

Further, the horizontally elongated part 56 of the wiring member 51 is separately recognized as the left wing side and the right wing side.

As shown in FIG. 15, in the present embodiment, a left wing side 61 of the first wiring member 51a is on the projecting part 26a of the transparent conductive anode layer 21 (the anode-side power supply pad part 22a, the transparent electrode-side power supply pad part), and the exposed portion (the A-side left pad 60a) of the left-line metal conductive layer 53a is in contact with the anode-side power supply pad part 22a which is the extending part of the transparent conductive anode layer 21.

With reference to FIG. 19B, as shown in the cross-sectional view taken along line B-B, the A-side left pad 60a of the wiring member 51 is overlaid on the projecting part 26a (the anode-side power supply pad part 22a) of the transparent conductive anode layer 21.

Further, the central portion of the first wiring member 51a is on the notch part 25a of the transparent conductive anode layer 21, and the exposed portion (the B-side pad 60b) of the middle-line metal conductive layer 53b is in contact with the cathode-side power supply pad part 23a.

With reference to FIG. 19A, as shown in the cross-sectional view taken along line A-A, the extending part 42a of the metal cathode layer 41 is in contact with the island part (the cathode-side power supply pad part 23a) which is independent of the transparent conductive anode layer 21, and the B-side pad 60b of the wiring member 51 is overlaid on the island part (the cathode-side power supply pad part 23a).

Further, the right wing side 62 of the first wiring member 51a is on the projecting part 26b (the anode-side power supply pad part 22b) of the transparent conductive anode layer 21.

Here, the central projecting part 26b of the transparent conductive anode layer 21 is longer than the opposite projecting parts 26a, 26c. Accordingly, the right wing side 62 of the first wiring member 51a covers substantially half the central projecting part 26b of the transparent conductive anode layer 21.

The exposed portion (the A-side right pad 60c) of the right-line metal conductive layer 53c is in contact with substantially half the anode-side power supply pad part 22b extending from the transparent conductive anode layer 21.

Similarly, the left wing side 63 of the second wiring member 51b covers substantially half the central projecting part 26b of the transparent conductive anode layer 21.

The exposed portion (the A-side left pad 60a) of the left-line metal conductive layer 53a is in contact with substantially half the anode-side power supply pad part (transparent electrode-side power supply pad part) 22b extending from the transparent conductive anode layer 21.

Further, the central portion of the second wiring member 51b is on the notch part 25b of the transparent conductive anode layer 21, and the exposed portion (the B-side pad 60b) of the middle-line metal conductive layer 53b is in contact with the cathode-side power supply pad part 23b.

Further, the right wing side 65 of the second wiring member 51b is on the projecting part 26c (the anode-side power supply pad part 22c) of the transparent conductive anode layer 21, and the exposed portion (the A-side right pad 60c) of the right-line metal conductive layer 53c is in contact with the anode-side power supply pad part 22c that is the extending part of the transparent conductive anode layer 21.

In the present embodiment, the sealing layer 6 that covers the organic EL element 10 is provided. Further, the printed circuit board 71 is overlaid on the sealing layer 6. Note that, the sealing layer 6 seals at least a region corresponding to the light-emitting region 2. In the present embodiment, the sealing layer 6 is not provided at the power supply part 17.

Next, a description will be given about the printed circuit board 71.

Figure 23:
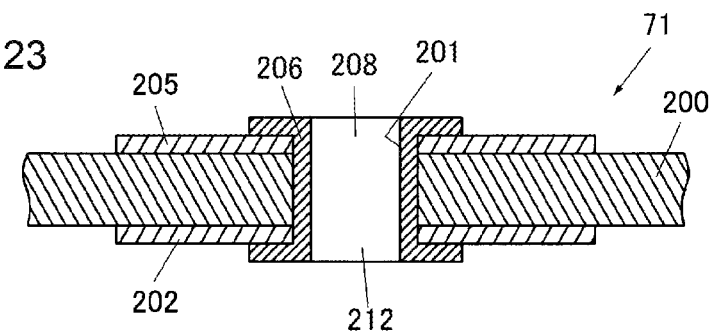
FIG. 23 is a cross-sectional view of the printed circuit board shown in FIGS. 14A and 14B.

As shown in FIG. 23, the printed circuit board 71 has a base substrate 200 made of resin or the like. On the front and back surfaces (the upper side in the drawing) of the base substrate 200, circuitry and the like are formed.

In the present embodiment, circuitry is formed just on one surface of the base substrate 200, and the other surface is substantially entirely a metal layer.

Further, numerous through holes 201 are formed at the base substrate 200. Accordingly, on the front and back surfaces of the printed circuit board 71, through hole openings 208, 212 that are the openings of the through holes 201 are opened.

In the present embodiment, the printed circuit board 71 is attached on the back surface side of the planar light-emitting tile 120.

In the printed circuit board 71 employed in the present embodiment, the surface of the base substrate 200, which is in contact with the planar light-emitting tile 120, is substantially covered with a metal layer (hereinafter referred to as a tile-side metal layer 202) entirely.

On the other hand, circuitry is formed on the back surface of the printed circuit board 71, and anode receiving terminals 103a, 103c, a cathode receiving terminal 103b, a power receiving terminal 101 and the like are mounted. Further, on the back surface of the printed circuit board 71, besides connecting lines 220, 221 connecting the above-described elements, a heat dissipation-side metal layer 205 is provided.

In the following, a description will be given of such elements.

As described above, on the planar light-emitting tile 120 side of the surface of the printed circuit board 71, the tile-side metal layer 202 is formed. The tile-side metal layer 202 is provided on the area shaded in FIG. 21A.

That is, as described above, the tile-side metal layer 202 is provided on a substantially entire area of one main surface of the printed circuit board 71.

Here, an area A of the tile-side metal layer 202 of the printed circuit board 71 corresponds to the area of the planar light-emitting tile 120. On the other hand, the above-described light-emitting region 2 is part of the planar light-emitting tile 120. Accordingly, the tile-side metal layer 202 is greater in area than the light-emitting region 2, and covers the entire region of the light-emitting region 2.

As in the present embodiment, the area A of the tile-side metal layer 202 is desirably greater than an area a of the light-emitting region 2, and the area A of the tile-side metal layer 202 is not less than most recommendably 120 percent of the area a of the light-emitting region 2.

It goes without saying that the area A of the tile-side metal layer 202 may be smaller than the light-emitting region 2. Further, the light-emitting region 2 may be partially not covered with the tile-side metal layer 202.

The area A of the printed circuit board 71 is desirably 70 percent, and recommendably 100 percent, as great as or greater than the area a of the light-emitting region of the planar light-emitting tile 120. Further, as described above, the area A of the tile-side metal layer 202 is most recommendably not less than 120 percent of the area a of the light-emitting region 2.

Depending on the circuit structure on the back surface, the tile-side metal layer 202 may not be able to entirely cover the light-emitting region 2.

The uncovered area of the light-emitting region 2 is not less than desirably 20 percent, more recommendably 5 percent, of the area a of the light-emitting region 2.

While the tile-side metal layer 202 desirably is metal exposed at one main surface of the printed circuit board 71, it may has its front surface covered with a thin insulating film.

As described above, the back surface side of the printed circuit board 71 (the side not being in contact with the planar light-emitting tile 120) is a circuit surface, where the anode receiving terminals 103a, 103c, the cathode receiving terminal 103b, the power receiving terminal 101 and the like are mounted. Further, the connecting lines 220, 221 connecting the above-described elements are provided.

Figure 20A:
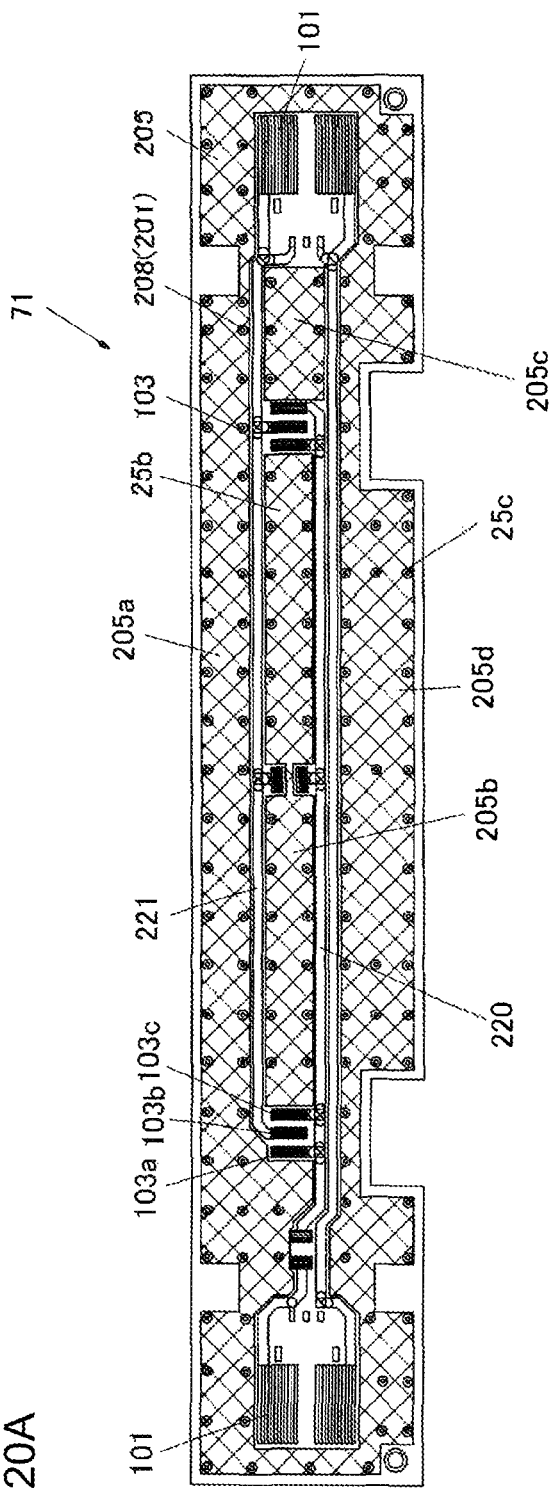
FIG. 20A is a plan view of the printed circuit board shown in FIGS. 14A and 14B showing the surface mounted onto the planar light-emitting tile side with a tile-side metal layer being shaded.
Figure 20B:
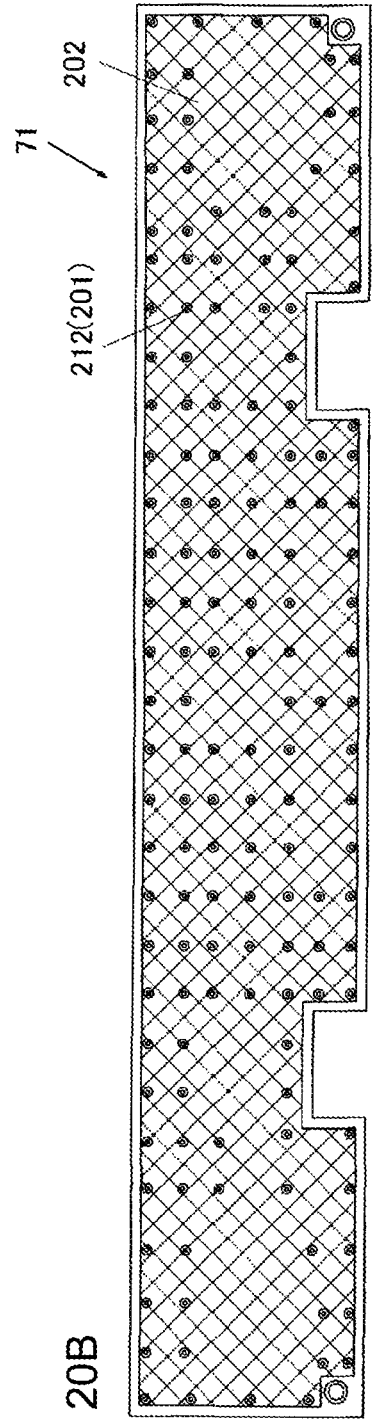
FIG. 20B is a bottom view showing the back surface of the printed circuit board shown in FIGS. 14A and 14B with a heat dissipation-side metal layer being shaded.
Figure 22:
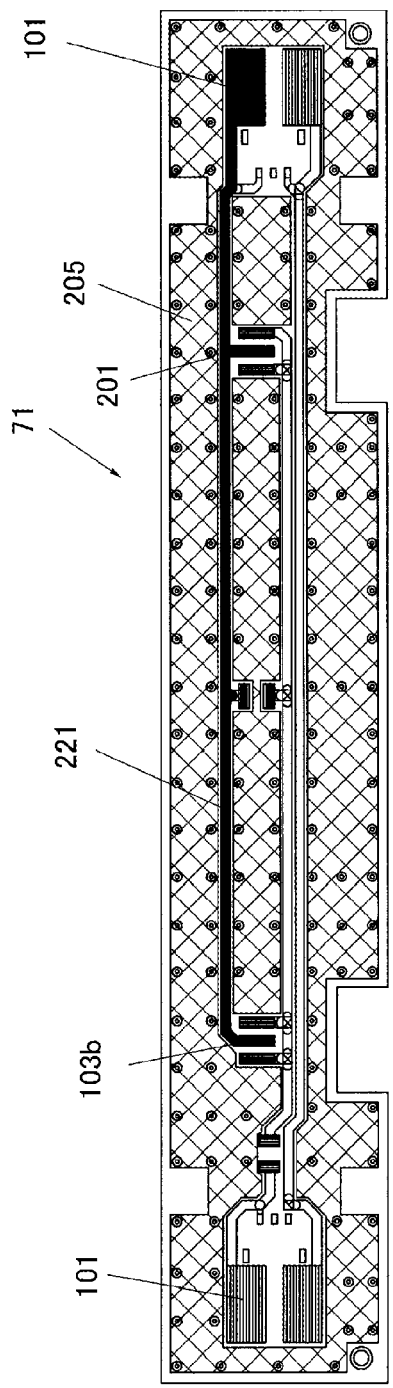
FIG. 22 is a bottom view of the printed circuit board shown in FIGS. 14A and 14B, in which a cathode connecting line is painted black.

The connecting lines include an anode connecting line 220 connecting the anode receiving terminals 103a, 103c and the power receiving terminal 101 shown in FIGS. 20 and 21, and a cathode connecting line 221 connecting the cathode receiving terminal 103b and the power receiving terminal 101 shown in FIGS. 20 and 22.

Further, as described above, on the back surface side of the printed circuit board 71, the heat dissipation-side metal layer 205 is formed.

The heat dissipation-side metal layer 205 is formed on a wide area excluding the above-described anode connecting line 220 and cathode connecting line 221.

In the present embodiment, the heat dissipation-side metal layer 205 is largely divided into three areas.

That is, in the present embodiment, the heat dissipation-side metal layer 205 is divided into a power supply-side heat dissipation-side metal layer 205a covering the power supply-side area, a central heat dissipation-side metal layer (large side) 205b and a central heat dissipation-side metal layer (small side) 205c covering the central area, and an other-side heat dissipation-side metal layer 205d covering the other side.

The power supply-side heat dissipation-side metal layer 205a, the central heat dissipation-side metal layers 205b, 205c, and the other-side heat dissipation-side metal layer 205d are each island-like, and electrically insulated from one another. Further, the power supply-side heat dissipation-side metal layer 205a, the central heat dissipation-side metal layers 205b, 205c, and the other-side heat dissipation-side metal layer 205d are insulated from the anode connecting line 220 and the cathode connecting line 221.

The heat dissipation-side metal layer 205 occupies most of the area of the printed circuit board 71 on the back surface side. A total area B of the heat dissipation-side metal layer 205 is not less than desirably 60 percent, recommendably 100 percent, of the area a of the light-emitting region of the planar light-emitting tile 120. Further, when possible, the total area B is not less than desirably 120 percent of the area a of the light-emitting region of the planar light-emitting tile 120.

The front surface of the heat dissipation-side metal layer 205 is covered with a thin insulating film.

As described above, numerous through holes 201 are formed at the printed circuit board 71. However, the through holes 201 are present at only the portions where the heat dissipation-side metal layer 205 exists.

As described above, the tile-side metal layer 202 is on the side of the base substrate 200 where the base substrate 200 is in contact with the planar light-emitting tile 120. The tile-side metal layer 202 solidly covers substantially the entire surface of the printed circuit board 71. Therefore, the through holes 201 penetrate through the printed circuit board 71 from the tile-side metal layer 202 to the heat dissipation-side metal layer 205. Further, the inner surface of the through holes 201 is coated with a metal layer 206 of silver or copper in any known manner.

Accordingly, the tile-side metal layer 202 on the planar light-emitting tile 120 side and the heat dissipation-side metal layer 205 on the back surface side are connected to each other by the highly thermally conductive metal layer 206.

Figure 25:
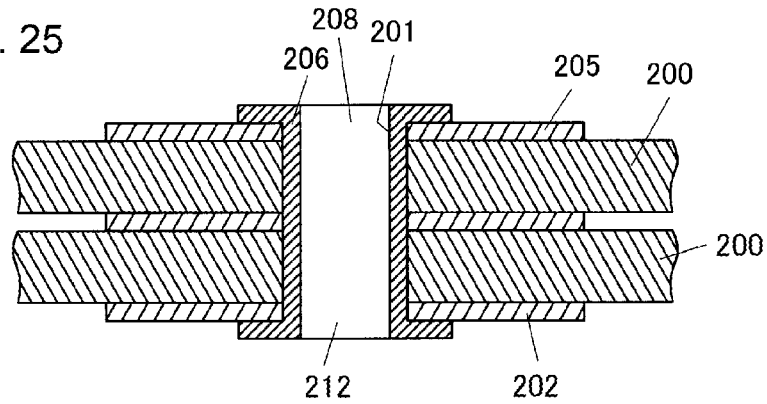
FIG. 25 is a cross-sectional view of a printed circuit board according to another embodiment of the present invention.

The above-described printed circuit board 71 includes one base substrate 200, one surface of which is the circuit surface and the other surface of which is the tile-side metal layer 202. On the other hand, the printed circuit board may have a structure including greater number of layers. For example, like the printed circuit board shown in FIG. 25, two base substrates 200 may be provided, and the tile-side metal layer 202 may be provided on one surface of the entire structure, and the circuitry may be provided at each of the back surface and the intermediate layer.

Next, a description will be given of the positional relationship between the printed circuit board 71 and the planar light-emitting tile 120.

As shown in FIG. 24, the printed circuit board 71 is attached to the back surface side of the planar light-emitting tile 120. That is, as shown in FIG. 24, the printed circuit board 71 is provided by being overlaid on the sealing layer 6 of the planar light-emitting tile 120. The printed circuit board 71 is oriented such that the tile-side metal layer 202 becomes in contact with the back surface of the planar light-emitting tile 120.

As described above, the sealing layer 6 is provided at the back surface of the planar light-emitting tile 120. The sealing layer 6 is flat. On the other hand, the tile-side metal layer 202 being the front surface side of the printed circuit board 71 is also flat. In the present embodiment, the tile-side metal layer 202 of the printed circuit board 71 is in close contact with the back surface of the planar light-emitting tile 120.

As described above, the tile-side metal layer 202 is provided over substantially the entire surface of the printed circuit board 71. The tile-side metal layer 202 is overlaid on the functional layer 31 with the sealing layer 6 and the metal cathode layer 41 being interposed between them.

That is, the tile-side metal layer 202 covers the light-emitting region 2.

Further, the tile-side metal layer 202 is greater in area than the light-emitting region 2. Therefore, it can be said that the tile-side metal layer 202 covers the tile-side metal layer 202 with a margin.

As shown in FIGS. 10 and 20, the printed circuit board 71 is provided with the anode receivers 103a, 103b and the cathode receiver 103c. The anode receivers 103a, 103b and the cathode receiver 103c are provided on the main surface which is opposite to the glass substrate 11.

Terminal parts 58 of the two wiring members 51a, 51b are connected to the printed circuit board 71. More specifically, the A-side left terminal 72a of the terminal part 58 is connected to the anode receiver 103a. The B-side terminal 73 is connected to the cathode receiver 103b. The A-side right terminal 72b is connected to the anode receiver 103c.

The organic EL element 10 is energized via the printed circuit board 71. That is, voltage is applied across the anode layer body region 27 of the transparent conductive anode layer 21 and the metal cathode layer body region 43 of the metal cathode layer 41, and current flows through the functional layer 31 of the organic EL element 10.

Here, in the present embodiment, a power supply portion (anode-side power supply pad parts 22a, 22b, 22c) extends in an elongated manner along one side of the anode layer body region 27. In addition, the anode layer body region 27 is small in width.

Accordingly, the resistance value across the power supply portion and each part of the anode layer body region 27 is substantially uniform.

That is, though the transparent electrode that forms the anode layer body region 27 is high in resistance, the anode layer body region 27 is supplied from the wide range and the width of the region is small. Therefore, the resistance value across the power supply portion and each part of the anode layer body region 27 less varies.

On the other hand, the metal cathode layer 41 is primarily low in resistance. Therefore, the resistance value of the metal cathode layer body region 43 is uniform.

As to the flow of current, the current supplied from the printed circuit board 71 flows from the terminal part 58 of the wiring member 51a, 51b to the left-line metal conductive layer 53a and the right-line metal conductive layer 53c. Then, through the A-side pads 60a, 60c, the current is supplied to the anode-side power supply pad parts (transparent electrode-side power supply pad parts) 22a, 22b, 22c. The current further flows from the anode-side power supply pad parts 22a, 22b, 22c to the anode layer body region 27, and to the functional layer (light-emitting functional layer) 31. The current further flows to the metal cathode layer 41 on the back surface side, and arrives at the printed circuit board 71 via the cathode-side power supply pad part (metal electrode-side power supply pad part) 23a and the middle-line metal conductive layer 53b.

In the present embodiment, what functions as the electrode on the anode side of the organic EL element 10 is the transparent conductive anode layer 21, which is high in electrical resistance. Therefore, when the energizing path is long, voltage drops at the end side, which invites planar variations in the amount of current passing through the functional layer 31.

On the other hand, the module body 1 of the present embodiment has the elongated light-emitting region, and the transparent conductive anode layer 21 is supplied with power from the long side. In addition, the energizing path to the anode layer body region 27 that functions as an anode is rectangular and great in width. Further, since the light-emitting region is elongated and small in width, the energizing path of the transparent conductive anode layer 21 itself is short. Accordingly, voltage does not easily drop at the end side of the transparent conductive anode layer 21, whereby planar variations in the amount of current passing through the functional layer 31 are small.

Specifically, since the metal conductive layer 53 of the wiring members 51a, 51b is made of metal with small electrical resistance, such as copper, the resistance value is still low despite a change in the energizing distance to some extent, and voltage drop is negligible.

In the present embodiment, in the wiring members 51a, 51b leading to the transparent conductive anode layer 21, the exposed portion of the metal conductive layer 53 is long along the light-emitting region of the module body 1. However, as described above, the metal conductive layer 53 is metal with low electrical resistance, and voltage drop is negligible for a change in the energizing distance to some extent. Accordingly, voltage applied to the anode-side power supply pad parts 22a, 22b, 22c over the entire region of the horizontally elongated part 56 of the wiring member 51 is uniform.

Further, the anode-side power supply pad parts 22a, 22b, 22c are extending parts that project from the anode layer body region 27, and the length of the cross section of the portion connected to the anode layer body region 27 is great. Therefore, there is no resistance component when current flows from the anode-side power supply pad parts 22a, 22b, 22c to the anode layer body region 27.

Further, since the anode layer body region 27 itself is narrow, voltage drop in the anode layer body region 27 is small.

That is, in the anode layer body region 27, while current flows from the one long side 3 to the other long side 4, the distance between the supplying long side 3 and the consuming long side 4 is small. Therefore, the potential of the other long side 4 of the anode layer body region 27 does not largely differ from that around the supplying long side 3.

Therefore, the potential on the surface of the anode layer body region 27 is uniform.

Further, the metal conductive layer 53 opposing to the anode layer body region 27 is primarily low in electrical resistance due to its being made of metal, and therefore the potential of the metal cathode layer body region 43 is uniform.

Accordingly, the voltage distribution among each part of the anode layer body region 27 and each part of the metal cathode layer body region 43 is uniform, and current uniformly flows through the functional layer 31. Therefore, current evenly flows from the entire surface of the anode layer body region 27 to the entire surface of the metal cathode layer body region 43.

Further, while energizing the planar light-emitting tile 120 causes the functional layer (light-emitting functional layer) 31 to generate heat, in the present embodiment, the tile-side metal layer 202 provided at the printed circuit board 71 and the heat dissipation-side metal layer 205 diffuse the heat, and thus the heat is smoothly dissipated.

That is, while energizing the planar light-emitting tile 120 causes the functional layer 31 to generate heat, the entire surface of the functional layer 31 is covered with the tile-side metal layer 202 via the metal cathode layer 41 and the sealing layer 6. Further, as shown in FIG. 24, the tile-side metal layer 202 is in planar-contact with the sealing layer 6 of the planar light-emitting tile 120. Accordingly, the heat generated at the functional layer 31 is transferred to the tile-side metal layer 202.

Further, the tile-side metal layer 202 is in contact with the heat dissipation-side metal layer 205 via the metal layer 206 of the through holes 201.

Therefore, the heat transferred to the tile-side metal layer 202 is transferred to the heat dissipation-side metal layer 205 via the metal layer 206 of the through holes 201.

Here, in the present embodiment, while a thin insulating film exists on the heat dissipation-side metal layer 205, on the outer side of the heat dissipation-side metal layer 205, there exists a space that is surrounded by the leg parts 87a, 87b along the long sides and the leg parts 88a, 88b along the short sides and has a height not less than ¼ of the height H of the leg part body 80.

Therefore, the heat dissipation-side metal layer 205 is exposed to the space and thus cooled.

Accordingly, the heat generated at the functional layer 31 is absorbed by the tile-side metal layer 202 and transferred to the heat dissipation-side metal layer 205 via the metal layer 206 of the through holes 201, and dissipated to the atmosphere from the heat dissipation-side metal layer 205.

Thus, the heat does not stay in the planar light-emitting tile 120.

In this manner, in the light-emitting module 100 according to the present embodiment, the voltage distribution among each part of the anode layer body region 27 and each part of the metal cathode layer body region 43 is uniform, and current uniformly flows through the functional layer 31. Further, heat generated at the functional layer 31 is smoothly dissipated. Thus, the planar light-emitting region 2 uniformly emits light.

In the foregoing, the description has been given of the overall structure of the module body 1. In the following, with reference to the drawings, a description will be given of the constituents including the detailed structure and the manufacturing method.

(Light-Emitting Module)

Figure 1:
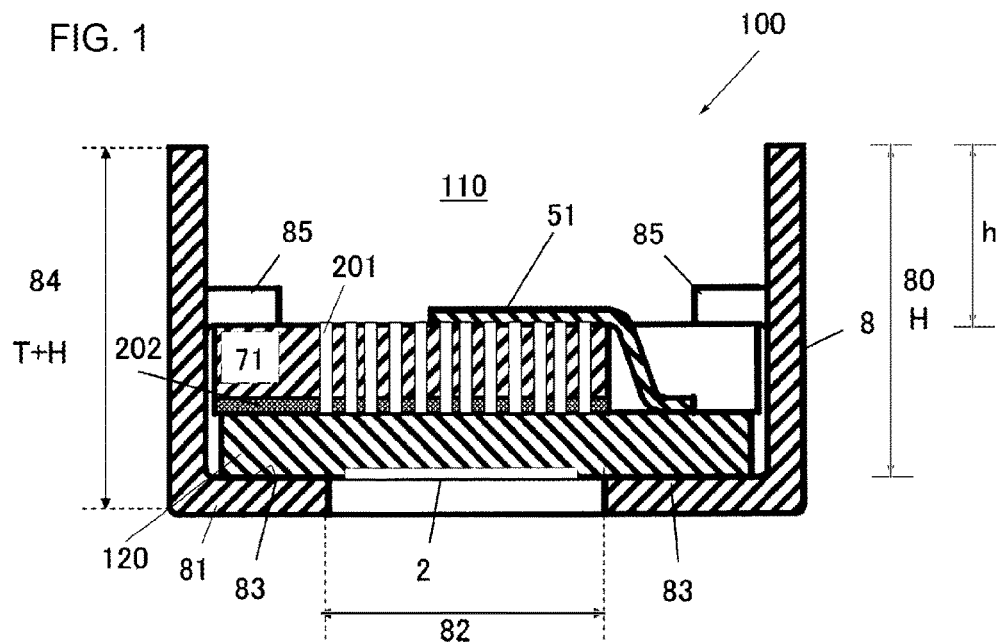
FIG. 1 is a cross-sectional view showing a light-emitting module 100 according to one embodiment of the present invention.

FIG. 1 is a cross-sectional view showing the light-emitting module 100 of the present invention.

As shown in FIG. 1, the light-emitting module 100 of the present invention includes the bezel 8, the planar light-emitting tile 120, and the printed circuit board 71. Further, the light-emitting module 100 preferably further includes the wiring member 51. The planar light-emitting tile 120 having the light-emitting region 2 at its light-emitting main surface is held between the bezel 8 and the printed circuit board 71.

A preferable planar light-emitting tile 120 is an organic EL planar light-emitting tile. A preferable bezel is the metal bezel 8.

For example, the light-emitting module 100 may be manufactured by: employing the planar light-emitting tile (organic EL planar light-emitting tile) 120, the wiring member 51, the printed circuit board 71, and the metallic bezel 8 as the basic constituent members, bonding the wiring member 51 and the printed circuit board 71 to the planar light-emitting tile 120, and installing the same in the metal-made bezel 8.

The light-emitting module 100 of the present invention is an illumination device that causes the light-emitting region 2 to emit light from its light emitting surface side. The light-emitting module 100 specifically is an illumination device that radiates light generated by the light-emitting element (the organic EL element 10) in the planar light-emitting tile 120, from the radiation opening 82 provided at the rim part 81 of the bezel 8.

That is, as shown in FIG. 1, the bezel 8 has the rim part 81 that has a portion (the abutting part 83) being in contact with the planar light-emitting tile 120, and the radiation opening 82 is provided at the rim part 81. The light-emitting module 100 is an illumination device that emits light generated by the light-emitting element in the planar light-emitting tile 120 from the radiation opening 82 that corresponds to the light-emitting region 2 of the planar light-emitting tile 120.

Here, in consideration of effective use of light generated in the planar light-emitting tile 120, as seen in a plan view, the light-emitting region 2 is preferably included in the radiation opening 82. In other words, the non light-emitting region on the light-emitting main surface (the front surface) of the planar light-emitting tile 120 preferably abuts on the abutting part 83.

As to the outer shape of the light-emitting module 100 of the present invention, in order to implement a compact illumination device relative to its light-emitting region 2, the outer shape of the radiation opening 82 is preferably identical or similar to that of the light-emitting region 2. The outer shape of the light-emitting module 100, that is, the outer shape of the rim part 81 is preferably similar to the radiation opening 82. It is preferable to implement an elongated quadrangular module (an elongated module) that has the elongated quadrangular light-emitting region 2 having a great length relative to its width, and the outer shape of the similarly elongated shape. Suitably, the light-emitting module 100 has a width equal to or smaller than 30 mm, and a length equal to or greater than 100 mm.

It goes without saying that the outer shape of the light-emitting module 100 may be a triangle, a quadrangle including a square, other polygons, or an ellipse including a perfect circle. However, in order to fully use the advantage of the reduced area of the rim part 81 which is one of the characteristics of the present invention, and apply the light-emitting module 100 to a system capable of evenly illuminating an elongated illumination target, the outer shape of the light-emitting module 100 is desirably rectangular.

(Planar Light-Emitting Tile 120)

Figure 2:
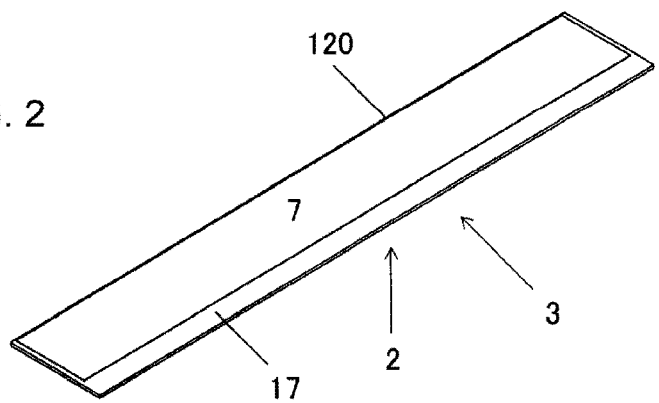
FIG. 2 is a perspective view showing a planar light-emitting tile 120 according to one embodiment of the present invention.

FIG. 2 is a perspective view showing the planar light-emitting tile according to one embodiment of the present invention.

The planar light-emitting tile 120 of the present invention is a plate-like member having opposite main surfaces, namely, the light-emitting main surface (the lower side in FIG. 1) having the light-emitting region 2 and the non light-emitting main surface (the upper side in FIG. 1). The planar light-emitting tile 120 includes therein the light-emitting element (the organic EL element 10 or the like). In the present specification, the planar light-emitting tile 120 is referred to as the organic EL tile when the light-emitting element includes the organic EL element 10, and the planar light-emitting tile 120 is referred to as the LED tile when it includes just an LED element.

The non light-emitting main surface preferably includes an electrode-side power supply pad region (the power supply part 17) that is not sealed, which will be described later, in order to facilitate establishing electrical connection for supplying power to the light-emitting element. Further, in order to prevent entry of moisture or the like to the light-emitting element to thereby reliably attain long lifetime and high reliability, when seen in a plan view, a sealed region 7 which is continuously sealed over the region including the light-emitting region 2 is preferably provided. The sealed region 7 will be described later.

Here, as described above, when the planar light-emitting module 100 is an elongated module, which is the preferred embodiment, preferably the electrode-side power supply pad regions (the pad regions 28, 45) are provided just along one long side 3 which is one of the opposite long sides of the planar light-emitting module 100. In this manner, as described above, the sealed region 7 including the light-emitting region 2 when seen in a plan view is provided unevenly, that is, just along the other long side which is the other one of the opposite long sides. However, by virtue of the light-emitting region 2 being elongated, a light-emitting module being compact and exhibiting high area efficiency while maintaining the power supply which does not cause luminance distribution is implemented.

Among various types of planar light-emitting tiles, with an organic EL planar light-emitting tile (an organic EL tile), the most cost-effective internal wiring can be employed, and soft planar light-emission can be realized with a single light-emitting element. Therefore, an organic EL planar light-emitting tile (an organic EL tile) is a suitable embodiment of the planar light-emitting tile 120. In the following, a detailed description is given about the organic EL planar light-emitting tile (the organic EL tile).

Firstly, the organic EL planar light-emitting tile (the planar light-emitting tile 120) according to the present invention preferably has the organic EL element 10 that includes just a light-emitting element whose equipotential electrodes directly supplied with power from the outside of the organic EL tile are just a single positive and negative opposing pair of electrodes, in order to improve the area efficiency and the like.

That is, the organic EL planar light-emitting tile desirably has one transparent conductive anode layer 21 and one metal cathode layer 41, between which one functional layer (light-emitting functional layer) 31 is interposed.

Such an organic EL element 10 is structured as follows, for example. On the glass substrate 11, the light-pervious conductive anode layer 21, the functional layer 31, and the metal cathode layer 41 each in a predetermined shape are formed.

The glass substrate 11 is a preferable substrate in view of transparency and sealability. The glass substrate 11 is positioned on the light-emitting main surface of the light-emitting element.

The functional layer 31 is made up of a plurality of laminated thin films including a light-emitting layer containing an organic compound.

Preferably, the organic EL element 10 formed in this manner is sealed.

Further, in order to improve luminance, color, and angle-dependent optical characteristics, the organic EL planar light-emitting tile (the planar light-emitting tile 120) is preferably provided with an optical functional body on the light emission side of the glass substrate 11.

That is, the optical functional body is preferably provided on the outermost surface of the region including the light-emitting region 2 on the light-emitting main surface side.

The optical functional body may be formed by nanoimprinting by applying resin such as acrylic resin on the glass front surface, or spray coating or slit coating of resin containing glass beads. Further, the optical functional body is preferably formed by bonding a resin film (an optical film)

having a fine irregular structure on one surface and having adhesive on another surface to a glass surface, so that the one surface becomes the above-described outermost surface. This optical film preferably has the light scattering characteristic. Further, since the surface of the film is susceptible to scratches, depending on the circumstances, the bonding of the optical film may be performed after assembling the organic EL planar light-emitting tile (the planar light-emitting tile 120), and before or after attaching the wiring member 51. Alternatively, the bonding of the optical film may be performed after attaching the planar light-emitting tile 120 to the bezel 8 of the present invention.

(Wiring Member 51)

Figure 3:
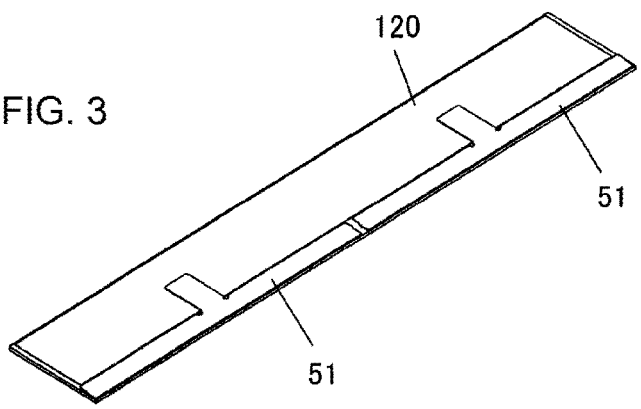
FIG. 3 is a perspective view of the planar light-emitting tile 120 of the present invention including a wiring member 51 of the present invention.

FIG. 3 is a perspective view showing an exemplary planar light-emitting tile 120 of the present invention having the wiring member 51 of the present invention. FIGS. 9A and 9B are external views of a wiring member 51 according to Example being an exemplary wiring member 51 of the present invention.

As shown in FIG. 3, to the planar light-emitting tile 120 of the present invention, the wiring member 51 is preferably attached for being supplied with power from an external source. This wiring member 51 includes the pad portion (the horizontally elongated part 56). In order to reduce the thickness of the planar light-emitting tile 120, as shown in FIGS. 9A and 9B, the wiring member 51 is a flat plate-like member whose opposite main surfaces are the wiring surface and the wiring member back surface, respectively. Further, the wiring member back surface is more preferably an insulating surface. Preferably, the anode pad included in the pad portion is connected to the anode-side power supply pad part 22 of the electrode-side power supply pad region (the pad region 28), and the cathode pad included in the pad portion is connected to the cathode-side power supply pad part 23 of the electrode-side power supply pad region (the pad region 45).

Further, the wiring member 51 preferably includes the terminal portion 58 as the conduction path between the pad portion and the external power supply. The terminal portion 58 includes an anode terminal electrically connected to the anode pad and a cathode terminal connected to the cathode pad. Further, preferably, the planar light-emitting tile 120 including the printed circuit board 71 and the wiring member 51 serves as the module body 1, in which the wiring member 51 includes a terminal portion exposed to the back surface side of the module body 1.

Here, the terminal portion is preferably a flat plate-like member whose opposite main surfaces are the terminal surface and the terminal portion back surface, respectively. The terminal portion back surface is more preferably an insulating surface. As described above, when the wiring member 51 is a flat plate-like member whose opposite main surfaces are respectively the wiring surface and the wiring member back surface, more preferably, the terminal surface is included in the wiring surface, and the terminal portion back surface is included in the wiring member back surface. In this manner, the terminal surface where the terminals are disposed becomes the surface that opposes to the non light-emitting main surface of the planar light-emitting tile 120 of the planar light-emitting tile 120, and a so-called single-surface wired wiring member is obtained. Thus, since electric shock hazards are avoided by virtue of the energized portion not being exposed on the back surface side of the module body 1, excellent safety is achieved. Further, the terminals preferably exist in the light-emitting region 2 when seen in a plan view. Thus, the size of the planar light-emitting tile 120 can be reduced for the size of its light-emitting region 2.

While the wiring member 51 of the present invention may be made of a lead wire, copper foil, aluminum foil or the like, the wiring member 51 is desirably a printed circuit board. More preferably, the wiring member 51 is a flexible printed circuit (FPC). The flexible printed circuit (FPC) is an organic film of polyimide or the like, on which wiring made of copper foil or aluminum foil is patterned. The small thickness of the flexible printed circuit (FPC) allows a reduction in thickness of the panel (the module body 1) including the flexible printed circuit (FPC), and allows the panel to be freely bent.

While the pad portion of the wiring member 51 may be connected to the power supply pad parts 22, 23 using conductive adhesive, in order to improve connection reliability by improving bonding strength, desirably the pad portion is thermocompression-bonded using an anisotropic conductive film (ACF).

The wiring member 51 of the present invention may be a member that extends from the portion connected to the planar light-emitting tile 120 just to the portions where supply of power from an external source reaches. Further, the wiring member 51 covering the entire back surface of the planar light-emitting tile 120 can additionally acquire the function as a soaking plate. In this manner, the wiring member 51 that additionally acquires the function as a soaking plate makes it possible to use adhesive in bonding the wiring member 51 to the planar light-emitting tile 120, in addition to establishing electrical connection. Also, it also makes it possible to use an adhesive film such as a double-sided tape for reducing the work man-hours.

(Printed Circuit Board 71)

Figure 4:
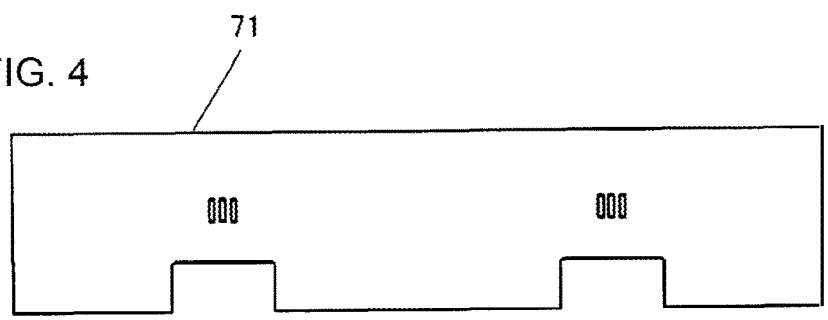
FIG. 4 is an external view showing an exemplary printed circuit board 71 of the present invention.

FIG. 4 is an external view showing an exemplary printed circuit board 71 of the present invention. FIGS. 10A and 10B are external views of a printed circuit board 71 according to Example, an exemplary printed circuit board 71 of the present invention. FIGS. 14A and 14B are a detailed external view of the printed circuit board 71 according to Example, which is an exemplary printed circuit board 71 of the present invention.

Figure 6:
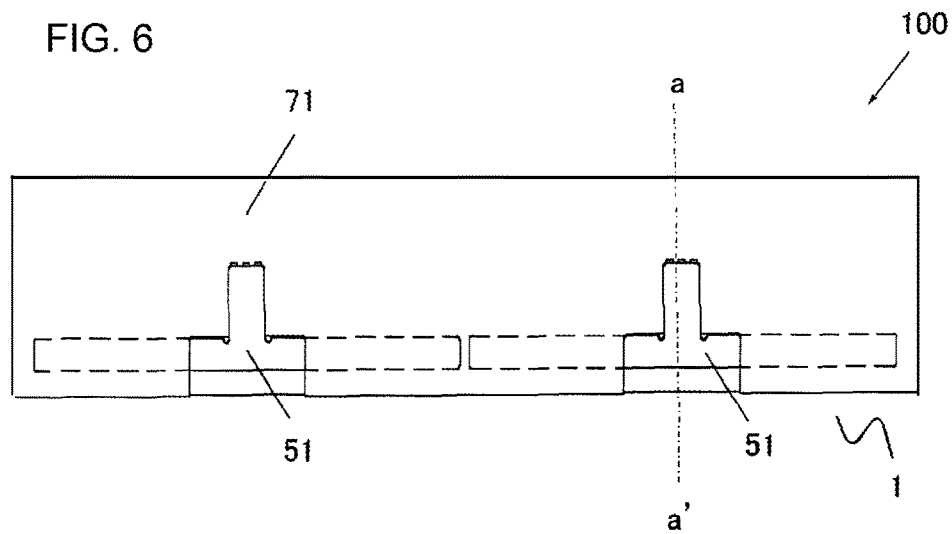
FIG. 6 is a back surface-side external view showing an exemplary planar light-emitting tile 120 (a module body 1) having the printed circuit board 71 of the present invention and the wiring member 51 of the present invention.

Further, FIG. 6 is a back surface-side external view showing an exemplary planar light-emitting tile 120 (the module body 1) that includes the printed circuit board 71 and the wiring member 51 of the present invention. In FIG. 6, a shielded portion of the wiring member 51 that does not appear by being shielded by the printed circuit board 71 is represented by broken lines. The upper portion of the wiring member 51 in FIG. 6 corresponds to the above-described terminal portion exposed on the back surface side of the module body 1.

Further, the cross-sectional view of the FIG. 1 corresponds to a cross-sectional view which is obtained by combining a cross-sectional view taken along alternate long and short dashed lines a-a' in FIG. 6 and a cross-sectional view of the bezel 8 which is mounted afterward.

The printed circuit board 71 has the function of supplying power from an external source to the planar light-emitting tile 120, preferably via the wiring member 51.

The printed circuit board 71 is supported by the bezel 8 by being held between the fold-in parts 85 of the leg part 84 of the bezel 8, which will be described later, and the planar light-emitting tile 120. More preferably, the printed circuit board 71 is supported at the position H/4 to 3H/4 in the direction from the abutting part 83 of the bezel 8 toward the end of the leg part 84. That is, the printed circuit board 71 is supported such that its entire thickness falls within a range from H/4 to 3H/4 in the direction from the abutting part 83 of the bezel 8 toward the end of the leg part 84. Further, preferably, the printed circuit board 71 is held between the above-described terminal portion of the wiring member 51 and the planar light-emitting tile 120.

As shown in FIGS. 10A and 10B, the printed circuit board 71 is a flat plate-like member whose opposite main surfaces are respectively the tile-side main surface disposed so as to oppose to the back surface side of the planar light-emitting tile 120, and the back surface-side main surface opposite to the tile-side main surface.

The printed circuit board 71 has the circuit surface where the anode receiving terminals 103a, 103c connected to the anode terminals 72a, 72b of the wiring member 51, and the cathode receiving terminal 103b connected to the cathode terminal 73 are disposed.

The printed circuit board 71 is positioned so that the anode terminals 72a, 72b and the cathode terminal 73 of the wiring member 51 are connected to the anode receiving terminals 103a, 103c and the cathode receiving terminal 103b, respectively. Since the receiving terminal portion of the printed circuit board 71 including the anode receiving terminals 103a, 103c and the cathode receiving terminal 103b is shielded and protected by the wiring member 51 of the present invention, electric shock hazards are avoided and therefore safety improves.

As shown in FIGS. 1, 14A, 14B, and 20, the printed circuit board 71 has a plurality of through holes 201, and the tile-side main surface includes tile-side through hole openings 212 where the plurality of through holes 201 open. Further, one of the characteristics of the present invention is that the metal layer (tile-side metal layer) 202 including the entire light-emitting region 2 as seen in a plan view is formed on the tile-side main surface. Further, the back surface-side main surface includes back surface-side through hole openings 208, which are the openings of the plurality of through holes corresponding to the tile-side through hole openings 212 as openings of the same through holes on the opposite side.

In addition, the printed circuit board 71 preferably has the power receiving terminal 101 for receiving power from an external source. The power receiving terminal 101 is more preferably disposed on the circuit surface. The power receiving terminal 101 is further preferably a connector. As a result, the power supply line from the external source to the printed circuit board (PCB) 71 can be easily removed. Further, the circuit wiring that distributes power from the power receiving terminal 101 to the receiving terminal 103 is also preferably disposed on the circuit surface, and more preferably the exposed surface of the circuit wiring is electrically insulated. As a result, electric shock hazards at the printed circuit board 71 are avoided and safety improves.

In addition, when a protective circuit, for example an overvoltage short-circuiting protective circuit, is provided on the circuit surface of the printed circuit board (PCB) 71, excessive generation of heat can be prevented even though the resistance of the constituent members increases due to use for long hours. Further, when the printed circuit board 71 is provided with a reverse-current preventing circuit, sudden reverse current to the planar light-emitting tile 120 can be avoided. Thus, despite the multi-function of the light-emitting module 100, the light-emitting module 100 which is less prone to fail is desirably obtained.

Further, when a dimming circuit that dims light of the light-emitting element (the organic EL element 10) is provided on the circuit surface of the printed circuit board (PCB) 71, the multi-functional light-emitting module 100 is desirably obtained.

In attaching the printed circuit board 71 to the planar light-emitting tile 120, adhesive may be used. Preferably, in order to reduce the number of work man-hours, a double-sided tape may be used. As has been described above, the printed circuit board 71 is preferably provided with the receiving terminal connected to the wiring member 51. This connection may be achieved by soldering, using a conductive paste, ACF connection, or mounting a connector.

(Bezel 8)

As shown in FIG. 7, to the module body 1, which is the planar light-emitting tile 120 including the printed circuit board 71 and preferably the wiring member 51, the bezel 8 according to the present invention is attached. That is, FIG. 7 is an exploded perspective view of the light-emitting module 100 of the present invention.

The bezel 8 of the present invention includes the rim part 81, and the leg part 84 that is perpendicular to the planar light-emitting tile 120, is continuous to the rim part 81, and is integrally formed.

As shown in FIG. 1, the rim part 81 has the thickness T, and surrounds the radiation opening 82 corresponding to the light-emitting region 2 of the present invention and relating to radiation of the present invention. The rim part 81 has the abutting part 83 on the surface in a certain direction of the leg part 84, which will be described later.

Further, the leg part 84 preferably has the fold-in parts 85 which are partially folded in toward the planar light-emitting tile 120. The printed circuit board 71 can be held between the fold-in parts 85 and the planar light-emitting tile 120.

Further, as shown in FIG. 5, the leg part 84 preferably has notch parts 86 formed by the leg part 84 being partially cut out from the end thereof toward the rim part 81. Provision of the notch parts 86 makes it possible to house an external power supply line for externally supplying power to the planar light-emitting tile 120, and preferably to the printed circuit board 71.

FIG. 5 is a perspective view showing an exemplary bezel 8. Note that, in FIG. 8, the fold-in part 85 before being folded for supporting is marked as (85).

When the light-emitting module 100 of the present invention is an elongated module as described above, the rim part 81 of the bezel 8 has a quadrangular outer shape including two long sides and two short sides. The leg part 84 of the bezel 8 includes two long sides leg part and two short side leg parts that are perpendicular to the rim part 81. Here, the fold-in parts 85 are preferably provided at the opposite two long sides of the leg part, and the notch parts 86 are preferably provided at the opposite two short sides of the leg part.

The bezel 8 of the present invention is preferably made of metal. The bezel 8 may be formed by a steel plate having its surface electroplated, or may be preferably a stainless steel plate which is rust-resistant. Further, the bezel 8 may be painted.

EXAMPLE

In the following, a description will be given of specific Example of the present invention.

Example

Employing a glass substrate on which a transparent conductive metal oxide film ITO is deposited and which has a thickness of 0.7 mm, the elongated organic EL planar light-emitting tile 120 was fabricated as the planar light-emitting tile 120 of the present invention. Attaching the wiring member 51 and the printed circuit board 71 to the elongated organic EL planar light-emitting tile 120, the module body 1 was fabricated. Attaching the bezel 18 to the module body 1, the elongated organic EL module 100 was fabricated as the light-emitting module 100 of the present invention. In the elongated organic EL planar light-emitting tile 120, the outer shape of the glass being identical to the outer shape of the elongated organic EL planar light-emitting tile 120 measures 142 mm×23 mm, and the light-emitting region 2 measures 137.5 mm×15.1 mm.

Firstly, on the glass substrate 11, the following transparent conductive anode layer (transparent conductive layer) 21 and cathode-side power supply pad part (metal electrode-side power supply pad part) 23 are formed by subjecting the ITO film to wet etching patterning, and thus the organic EL element formation-purpose substrate was provided. That is, in the region to be one long side 3 of the present invention, patterning was performed so that, in order from the short side, the following were formed: the anode-side power supply pad part (the transparent electrode-side power supply pad part) 22 having a length of 27 mm; an insulating region having a length of 5 mm; the cathode-side power supply pad part 23 (the transparent conductive island, metal electrode-side power supply pad part) having a length of 6.6 mm and a width of 4.54 mm; an insulating region having a length of 5 mm; the anode-side power supply pad part 22 having a length of 55.6 mm; the insulating region having a length of 5 mm; the cathode-side power supply pad part 23 having a length of 6.6 mm and a width of 4.54 mm; the insulating region having a length of 5 mm; and the anode-side power supply pad part 22 having a length of 27 mm.

Next, on the organic EL element formation-purpose substrate, as the functional layer 31, the following layers were deposited in order by vacuum deposition using a predetermined mask: the electron injection layer; the electron transport layer; the light-emitting layer; the hole transport layer; and the hole injection layer. Further thereon, the metal cathode layer 41 made of aluminum was deposited by vacuum deposition using a predetermined mask. Thus, the organic EL element 10 was formed.

Next, on the organic EL element 10, a silicon nitride film was formed by CVD using a predetermined mask. Subsequently, polysilazane was applied by splaying and baked, to form a sealing layer thereby sealing the organic EL element 10.

Next, on the sealed organic EL element 10, a protective film made of PET having adhesive is bonded. Thus, the organic EL tile 120 was fabricated.

Next, provided were two identical wiring members 51 each formed by a flexible printed circuit (FPC) and having a wiring layer formed on just one surface shown in FIGS. 9A and 9B to be the wiring surface, and the back surface of the wiring surface being the insulating wiring member back surface. The wiring members 51 were placed on the anode-side power supply pad part 22 and the cathode-side power supply pad part 23 of the organic EL tile 120 via the anisotropic conductive film (ACF), and further locally heated. Thus, the terminal portions of the wiring member boards (flexible printed circuits) 51 were thermocompression-bonded to the power supply pad parts. The temperature in thermocompression-bonding was 180° C. and the time taken for thermocompression-bonding was 15 seconds.

Separately, the printed circuit board (PCB) 71 having a wiring layer on each of its surfaces and having a thickness of 0.4 mm was provided. As shown in FIGS. 10A and 10B, the printed circuit board 71 had a connector component 101, on the circuit surface side of the printed circuit board 71, as a power receiving terminal for receiving power from an external source. Further, the printed circuit board 71 had a Zener diode component 102 wired thereto. The Zener diode component 102 operates as a protective circuit when voltage of 12V or greater is applied across the opposite electrode layers of the organic EL element 10. Further, the printed circuit board 71 had the surface of the circuit wiring insulated by being covered with resist, except for the receiving terminal 103 to which the wiring member (flexible printed circuit) 51 was connected.

Next, the printed circuit board 71 and the elongated organic EL planar light-emitting tile (the planar light-emitting tile 120) to which the wiring member (flexible printed circuit) 51 was bonded were combined, to fabricate the elongated organic EL panel (the module body 1) of the present invention shown in FIG. 11.

That is, the printed circuit board 71 was disposed so as to be interposed between the terminal portion of the wiring member (flexible printed circuit) 51 and the organic EL tile (the planar light-emitting tile 120). Then, using a double-sided tape having a thickness of 50 um, the printed circuit board 71 was bonded to the non light-emitting surface side of the organic EL tile (the planar light-emitting tile 120), so that the circuit surface of the printed circuit board 71 was positioned on the wiring member (FPC) 51 side. Thereafter, the terminal portion of the wiring member (FPC) 51 was connected to the receiving terminal 103 of the printed circuit board 71 with solder.

Figure 12:
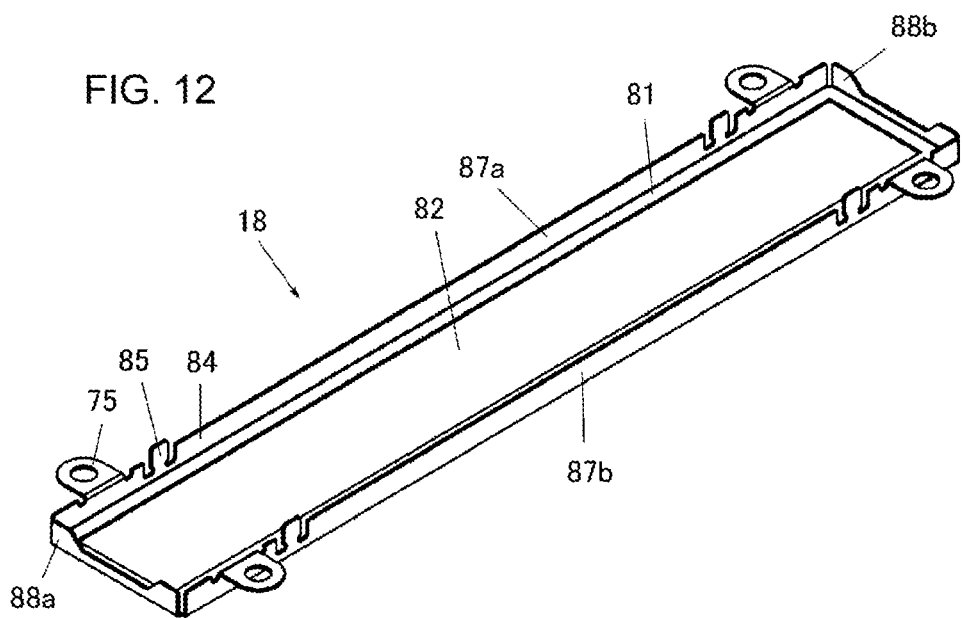
FIG. 12 is a perspective view of a bezel 18 according to other Example.

Separately, the bezel 18 was formed by subjecting a stainless steel plate having a thickness of 0.4 mm shown in FIG. 12 to press work.

Figure 13:
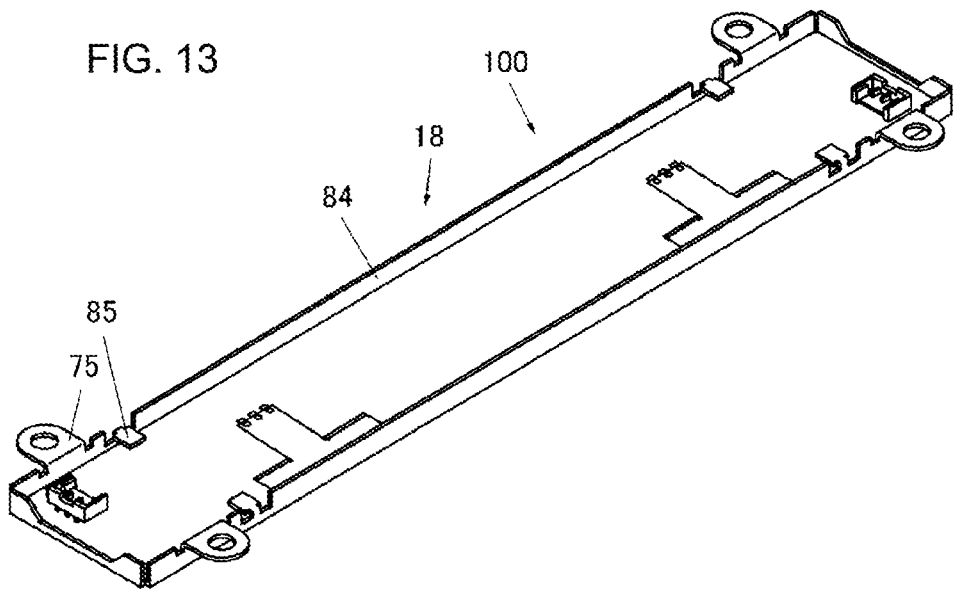
FIG. 13 is a perspective view of the light-emitting module 100 according to other Example.

Finally, the module body 1 was installed in the bezel 18. Note that, on the printed circuit board 71, a resin-made insulating cover was placed on the module body 1, so as to cover the entire surface including the Zener diode component 102 and particularly the soldered portion, and so as to exclude the connector component 101. In this state, four claw bent parts which were the fold-in parts 85 were bent so as to clamp the module body 1 and the cover with the abutting part 83 and the claw bent parts. Thus, they were fixed to the bezel 18. In this manner, the elongated organic EL module (the light-emitting module 100) shown in FIG. 13 were completed.

When the elongated organic EL module 100 was turned on, the in-plane luminance distribution of 95% or greater was attained, which was calculated by: (maximum luminance−minimum luminance)÷(maximum luminance+minimum luminance). Hence, the organic EL illumination of extremely uniform luminance distribution was obtained. Further, when the elongated organic EL modules 100 were arranged in the longitudinal direction and turned on, the non light-emitting region between the panels was 7.5 mm. Hence, the organic EL illumination panels with the extremely narrow non light-emitting region were obtained. In addition, on the back surface of the module, no energized portion was exposed. Further, by virtue of the protective element, in the event of sudden great voltage application, the protective circuit actuates so as to cause the current to bypass. Hence, safe organic EL illumination was obtained. Further, by virtue of the power receiving connector being implemented, ease in wiring and use is achieved with the organic EL illumination.

Further, the elongated organic EL module (the light-emitting module 100) has an extremely small finished total thickness of 4 mm. Thus, the organic EL illumination capable of being installed in any orientation is obtained.

LIST OF REFERENCE CHARACTERS

1: module body
2: light-emitting region
51: wiring member
71: printed circuit board
8, 18: bezel
80: leg part body
81: rim part
82: radiation opening
83: abutting part
84: leg part
85: fold-in part
86: notch part
100: light-emitting module (organic EL module, elongated module)
101: connector component (power receiving terminal)
102: Zener diode component
103: receiving terminal
120: planar light-emitting tile (organic EL tile)
201: through hole
202: tile-side metal layer
205: heat dissipation-side metal layer

The invention claimed is:

1. A light-emitting module comprising:
   a bezel;
   a planar light-emitting tile having a predetermined light-emitting region at least on a front surface side thereof; and
   a printed circuit board,
   wherein the planar light-emitting tile and the printed circuit board are installed in the bezel with the printed circuit board on a back surface side of the planar light-emitting tile,
   wherein the printed circuit board comprises:
   a base substrate;
   a tile-side metal layer on a planar light-emitting tile side of the base substrate; and
   a plurality of through holes connecting the tile-side metal layer to an other surface side of the base substrate,
   wherein the bezel comprises:
   a rim part having an opening; and
   a leg part having a leg part body that supports the rim part in mid-air,
   wherein the printed circuit board is located in a region surrounded by the leg part body,
   wherein a height H of the leg part body is greater than a total thickness of the planar light-emitting tile and the printed circuit board, and
   wherein a space formed over a back surface side of the printed circuit board is at least ¼ of the height H of the leg part body.

2. The light-emitting module according to claim 1, wherein a height h of the space over the back surface side of the printed circuit board is not less than H/4 and not more than 3H/4, H being the height of the leg part body.

3. The light-emitting module according to claim 1, wherein the tile-side metal layer of the printed circuit board has an area not less than 70 percent of an area of the light-emitting region of the planar light-emitting tile,
   wherein the printed circuit board further comprising a heat dissipation-side metal layer on the back surface side thereof, the heat dissipation-side metal layer being connected to the tile-side metal layer via the through holes, and
   wherein the heat dissipation-side metal layer has an area not less than 60 percent of the area of the light-emitting region of the planar light-emitting tile.

4. The light-emitting module according to claim 1, wherein the leg part further comprising a fold-in part partly along an end part thereof, the fold-in part supporting the printed circuit board.

5. The light-emitting module according to claim 4, wherein the module has an elongated quadrangular outer shape in which a length of the module is greater than a width of the module,
   wherein the bezel comprises:
   the rim part having a quadrangular outer shape with two long sides and two short sides;
   two long side leg parts opposite to each other; and
   two short side leg parts,
   the two long side leg parts and the two short side leg parts being perpendicular to the rim part, and
   wherein each of the two long side leg parts comprising the fold-in part.

6. The light-emitting module according to claim 1, wherein the leg part has a notch part for storage or passage of an external power supply line supplying the printed circuit board with power from an external source, the notch part being recessed from an end of the leg part toward the rim part partly in the leg part.

7. The light-emitting module according to claim 6, wherein the module has an elongated quadrangular outer shape in which a length is greater than a width,
   wherein the bezel comprises:
   the rim part having a quadrangular outer shape with two long sides and two short sides;
   two long side leg parts; and
   two short side leg parts opposite to each other,
   the two long side leg parts and the two short side leg parts being perpendicular to the rim part, and
   wherein each of the two short side leg parts comprising the notch part.

8. The light-emitting module according to claim 1, further comprising a power receiving terminal that is connected to an external power supply line on the back surface side of the printed circuit board.

9. The light-emitting module according to claim 1, further comprising a protective circuit and/or a dimming circuit on the back surface side of the printed circuit board.

10. The light-emitting module according to claim 1, further comprising
    a wiring member that electrically connects the planar light-emitting tile and the printed circuit board, the wiring member including a terminal portion having a terminal connected to the printed circuit board,
    wherein a receiving terminal is disposed on the back surface side of the printed circuit board, the receiving terminal being connected to the terminal of the wiring member.

11. The light-emitting module according to claim 1, wherein the planar light-emitting tile is an organic EL tile.

12. A light-emitting module comprising:
    a bezel that comprises a rim part surrounding a radiation opening, the rim part having a thickness T;
    a printed circuit board comprising a plurality of through holes; and
    a planar light-emitting tile having a light-emitting region on a light-emitting main surface thereof, wherein the planar light-emitting tile is interposed between the rim part and the printed circuit board, wherein light of the light-emitting region is radiated from the radiation opening of the rim part, wherein the bezel further comprising:

a predetermined abutting part being in contact with the planar light-emitting tile; and a leg part extending in a direction perpendicular to the planar light-emitting tile, the leg part having a height (T+H) including the thickness T of the rim part and integrated with the rim part, wherein the printed circuit board further comprising:

a tile-side metal layer located on a planar light-emitting tile side of the printed circuit board, the tile-side metal layer covering substantially the light-emitting region completely when seen in a plan view, the tile-side metal layer having tile-side through hole openings that are openings of the plurality of through holes; and back surface-side through hole openings located on a back surface side that is opposite side to the planar light-emitting tile side, the back surface-side through hole openings being openings of the plurality of through holes, and wherein the printed circuit board is supported by part of the bezel at a position H/4 to 3H/4 in a direction from the abutting part to an end of the leg part.

13. The light-emitting module according to claim 12, wherein the tile-side metal layer of the printed circuit board has an area not less than 70 percent of an area of the light-emitting region of the planar light-emitting tile, wherein the printed circuit board further comprising a heat dissipation-side metal layer on the back surface side thereof, the heat dissipation-side metal layer being connected to the tile-side metal layer via the through holes, and wherein the heat dissipation-side metal layer has an area not less than 60 percent of the area of the light-emitting region of the planar light-emitting tile.

14. The light-emitting module according to claim 12, wherein the leg part further comprising a fold-in part partly along an end part thereof, the fold-in part supporting the printed circuit board.

15. The light-emitting module according to claim 14, wherein the module has an elongated quadrangular outer shape in which a length of the module is greater than a width of the module, wherein the bezel comprises:

the rim part having a quadrangular outer shape with two long sides and two short sides;

two long side leg parts opposite to each other; and two short side leg parts, the two long side leg parts and the two short side leg parts being perpendicular to the rim part, and wherein each of the two long side leg parts comprising the fold-in part.

16. The light-emitting module according to claim 12, wherein the leg part has a notch part for storage or passage of an external power supply line supplying the printed circuit board with power from an external source, the notch part being recessed from an end of the leg part toward the rim part partly in the leg part.

17. The light-emitting module according to claim 16, wherein the module has an elongated quadrangular outer shape in which a length is greater than a width, wherein the bezel comprises:

the rim part having a quadrangular outer shape with two long sides and two short sides;

two long side leg parts; and two short side leg parts opposite to each other, the two long side leg parts and the two short side leg parts being perpendicular to the rim part, and wherein each of the two short side leg parts comprising the notch part.

18. The light-emitting module according to claim 12, further comprising a power receiving terminal that is connected to an external power supply line on the back surface side of the printed circuit board.

19. The light-emitting module according to claim 12, further comprising a protective circuit and/or a dimming circuit on the back surface side of the printed circuit board.

20. The light-emitting module according to claim 12, further comprising a wiring member that electrically connects the planar light-emitting tile and the printed circuit board, the wiring member including a terminal portion having a terminal connected to the printed circuit board, wherein a receiving terminal is disposed on the back surface side of the printed circuit board, the receiving terminal being connected to the terminal of the wiring member.

21. The light-emitting module according to claim 12, wherein the planar light-emitting tile is an organic EL tile.

* * * * *

UNITED STATES PATENT AND TRADEMARK OFFICE
CERTIFICATE OF CORRECTION

PATENT NO. : 10,304,905 B2
APPLICATION NO. : 15/525510
DATED : May 28, 2019
INVENTOR(S) : Hidemaro Saiki and Akira Nishikawa It is certified that error appears in the above-identified patent and that said Letters Patent is hereby corrected as shown below:

On the Title Page

Item (30), Foreign Application Priority Data, insert --Feb. 26, 2015 (JP) 2015-036097--

Signed and Sealed this
Twenty-third Day of July, 2019

Andrei Iancu
*Director of the United States Patent and Trademark Office*